United States Patent
Ito et al.

(10) Patent No.: US 10,951,194 B2
(45) Date of Patent: Mar. 16, 2021

(54) ACOUSTIC WAVE FILTER, MULTIPLEXER, AND COMMUNICATION APPARATUS

(71) Applicant: KYOCERA Corporation, Kyoto (JP)

(72) Inventors: Motoki Ito, Ikoma (JP); Shigehiko Nagamine, Yasu (JP); Tomofumi Nakamura, Shiga (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/954,837

(22) PCT Filed: Dec. 17, 2018

(86) PCT No.: PCT/JP2018/046381
§ 371 (c)(1),
(2) Date: Jun. 17, 2020

(87) PCT Pub. No.: WO2019/124316
PCT Pub. Date: Jun. 27, 2019

(65) Prior Publication Data
US 2021/0006227 A1 Jan. 7, 2021

(30) Foreign Application Priority Data

Dec. 20, 2017 (JP) .............................. JP2017-243703

(51) Int. Cl.
*H03H 9/25* (2006.01)
*H01Q 23/00* (2006.01)
(Continued)

(52) U.S. Cl.
CPC .............. *H03H 9/145* (2013.01); *H03H 9/25* (2013.01); *H03H 9/64* (2013.01); *H03H 9/72* (2013.01)

(58) Field of Classification Search
CPC ............... H01Q 23/00; H03H 2250/00; H03H 9/02535; H03H 9/0557; H03H 9/059;
(Continued)

(56) References Cited

U.S. PATENT DOCUMENTS

| 5,559,481 A | 9/1996 | Satoh et al. |
| 2004/0080384 A1* | 4/2004 | Takeda ................. H03H 9/6483 333/195 |

(Continued)

FOREIGN PATENT DOCUMENTS

| JP | H07-154201 A | 6/1995 |
| JP | 2000-174586 A | 6/2000 |

(Continued)

OTHER PUBLICATIONS

International Search Report and Written Opinion of the International Searching Authority for the international application No. PCT/JP2018/046381 dated Mar. 5, 2019, 5 pages.

*Primary Examiner* — Tan H Trinh
(74) *Attorney, Agent, or Firm* — Procopio Cory Hargreaves and Savitch LLP

(57) ABSTRACT

A filter body includes a serial arm and one or more parallel resonators in a state where they are connected in a ladder shape. The serial arm includes a plurality of serial resonators connected in series to each other. A difference of resonance frequencies among the plurality of serial resonators is smaller than a half of a difference between the resonance frequency and an antiresonance frequency of each serial resonator. The serial arm includes a first divided arm which extends from one side toward the other side in a predetermined direction on the piezoelectric substrate, and a second divided arm which is folded back from the other side of the first divided arm and extends toward the one side. The shield conductor includes a portion which is located between at (Continued)

least one of the serial resonators included in the first divided arm and at least one of the serial resonators included in the second divided arm.

12 Claims, 9 Drawing Sheets

(51) Int. Cl.
    *H03H 9/72*     (2006.01)
    *H03H 9/64*     (2006.01)
    *H03H 9/145*     (2006.01)

(58) Field of Classification Search
    CPC ............... H03H 9/1085; H03H 9/1092; H03H 9/14544; H03H 9/25; H03H 9/542; H03H 9/6479; H03H 9/6483; H03H 9/725
    USPC .......... 333/195, 133, 193; 310/313; 343/850
    See application file for complete search history.

(56) References Cited

U.S. PATENT DOCUMENTS

| | | | | |
|---|---|---|---|---|
| 2004/0251990 | A1* | 12/2004 | Ueda | H03H 9/25 333/195 |
| 2007/0194657 | A1* | 8/2007 | Morita | H03H 9/02551 310/313 A |
| 2008/0284540 | A1* | 11/2008 | Nishihara | H03H 9/725 333/133 |
| 2009/0096551 | A1* | 4/2009 | Yamagata | H03H 9/6483 333/193 |
| 2010/0225418 | A1* | 9/2010 | Kawamoto | H03H 9/725 333/133 |
| 2011/0215883 | A1* | 9/2011 | Fujiwara | H03H 9/64 333/195 |
| 2012/0105298 | A1* | 5/2012 | Inoue | H03H 9/725 343/850 |
| 2019/0181836 | A1* | 6/2019 | Nakai | H03F 3/245 |
| 2019/0245518 | A1* | 8/2019 | Ito | H03H 9/72 |
| 2020/0259481 | A1* | 8/2020 | Kimura | H03H 9/14502 |
| 2020/0287523 | A1* | 9/2020 | Urata | H03H 9/1085 |
| 2020/0295734 | A1* | 9/2020 | Urata | H03H 9/542 |

FOREIGN PATENT DOCUMENTS

| | | |
|---|---|---|
| JP | 2010-239612 A | 10/2010 |
| JP | 2015-070489 A | 4/2015 |

* cited by examiner

ACOUSTIC WAVE FILTER, MULTIPLEXER, AND COMMUNICATION APPARATUS

TECHNICAL FIELD

The present disclosure relates to an acoustic wave filter filtering electrical signals, and a multiplexer and communication apparatus each including the acoustic wave filter. The acoustic wave is for example a SAN (surface acoustic wave).

BACKGROUND ART

There is known an acoustic wave filter configured by connecting a plurality of acoustic wave resonators in a ladder shape (for example Patent Literature 1 and 2).

Patent Literature 1 discloses a ladder-type acoustic wave filter in which a shield conductor is provided between an input terminal inputting a signal to the acoustic wave filter or an output terminal outputting a signal from the acoustic wave filter and a wiring transmitting the signal in the acoustic wave filter.

Patent Literature 2 discloses a duplexer having a transmission filter configured by a ladder-type acoustic wave filter and a receiving filter configured by a ladder-type acoustic wave filter. The transmission filter and the receiving filter are connected to one input and output terminal and are arranged in a schematically U-shape as a whole. Patent Literature 2 discloses also an aspect providing a shield conductor between the transmission filter and the receiving filter.

CITATION LIST

Patent Literature

Patent Literature 1: Japanese Patent Publication No. H07-154201A

Patent Literature 2: Japanese Patent Publication No. 2010-239612A

SUMMARY OF INVENTION

An acoustic wave filter according to one aspect of the present disclosure includes a piezoelectric substrate, a filter body on the piezoelectric substrate, and a shield conductor connected to a reference potential part. The filter body includes a serial arm and one or more parallel resonators in a state where they are connected in a ladder shape. The serial am includes a plurality of serial resonators which are connected in series to each other. A difference of resonance frequencies among the plurality of serial resonators is smaller than a half of the difference between the resonance frequency and an antiresonance frequency of each serial resonator. The serial arm includes a first divided arm and a second divided arm. The first divided arm extends from one side to the other side in a predetermined direction relative to the piezoelectric substrate and includes at least the one serial resonator. The second divided arm is folded back from a portion on the other side of the first divided arm to extend to the one side and includes at least the one serial resonator. The shield conductor includes a portion which is located between at least one of the serial resonators included in the first divided arm and at least one of the serial resonators included in the second divided arm.

A multiplexer according to one aspect of the present disclosure includes an antenna terminal, a transmission filter connected to the antenna terminal, and a receiving filter connected to the antenna terminal. At least one of the transmission filter and the receiving filter is configured by the acoustic wave filter described above.

A communication apparatus according to one aspect of the present disclosure includes the acoustic wave filter described above, an antenna which is connected to one end of the serial arm, and an IC which is connected to the other and of the serial arm.

DESCRIPTION OF EMBODIMENTS

Figure 1:
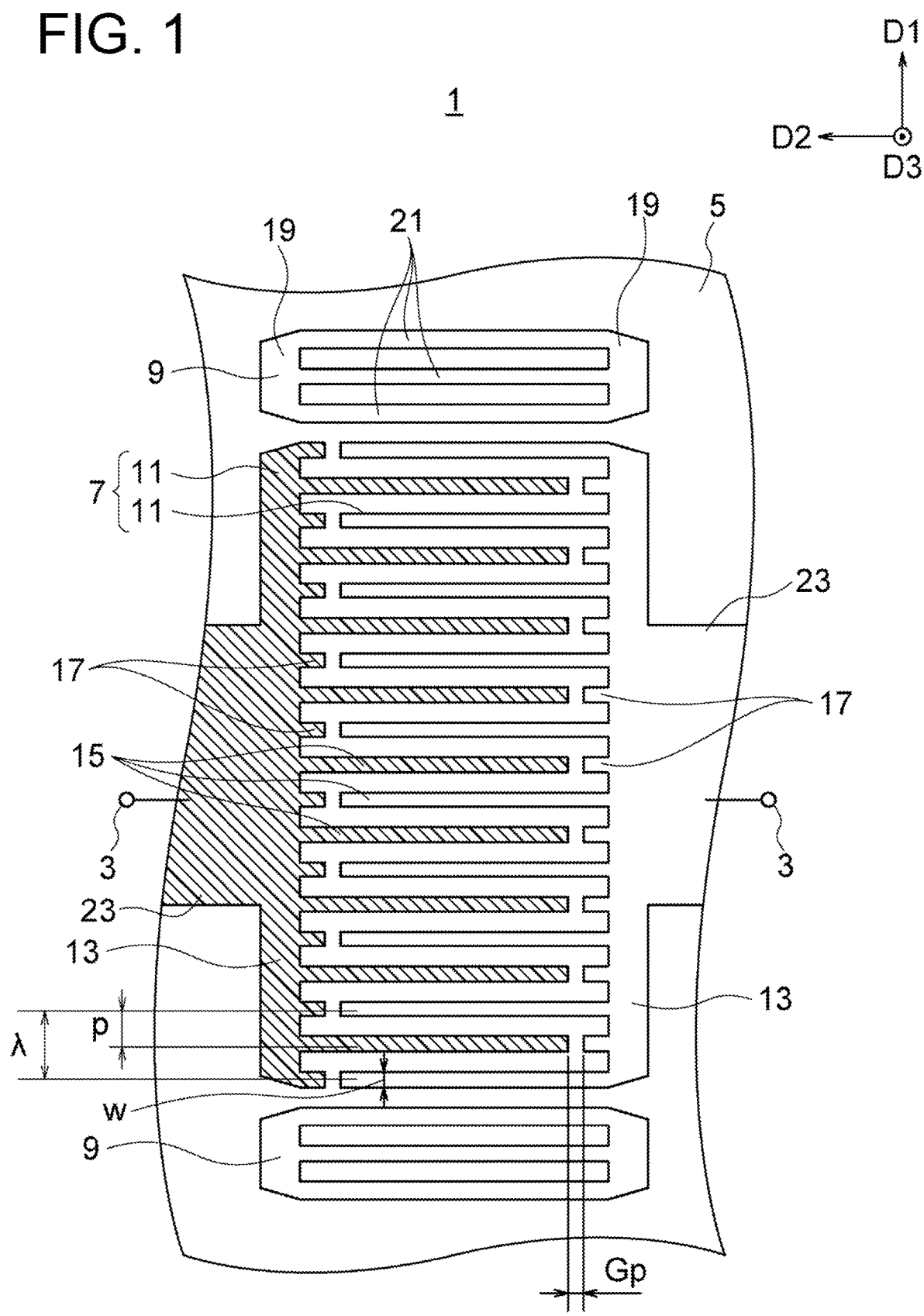
FIG. 1 is a plan view showing the configuration of a SAN resonator.

Below, embodiments of the present disclosure will be explained with reference to the drawings. Note that, the drawings used in the following explanation are schematic ones. Size ratios etc. in the drawings do not always coincide with the actual ones.

(Configuration of SAW Resonator)

FIG. 1 is a plan view showing the configuration of a SAN resonator 1 used in a SAN filter 51 (FIG. 2) according to an embodiment.

In the SAW resonator 1 (SAW filter 51), any direction may be defined as "above" or "below. In the following description, however, for convenience, an orthogonal coordinate system comprised of a D1 axis, D2 axis, and D3 axis will be defined, and sometimes the "upper surface" and other terms will be used where the positive side of the D3 axis (front side on the drawing sheet in FIG. 1) is the upper part. Note that, the D1 axis is defined so as to be parallel to the direction of propagation of a SAN propagating along the upper surface (surface on the front side on the drawing sheet, usually the broadest surface (major surface)) of the piezoelectric substrate 5 which will be explained later, the D2 axis is defined so as to be parallel to the upper surface of the piezoelectric substrate 5 and perpendicular to the D1 axis, and the D3 axis is defined so as to be perpendicular to the upper surface of the piezoelectric substrate 5.

The SAN resonator 1 configures a so-called 1-port SAN resonator. For example, it generates resonance when receiving as input an electrical signal having a predetermined frequency from one of the schematically shown two terminals 3 and outputs a signal where resonance occurs from the other of the two terminals 3.

Such a SAN resonator 1 for example has a piezoelectric substrate 5, an IDT electrode 7 provided on the piezoelectric substrate 5, and a pair of reflectors 9 which are positioned on the two sides of the IDT electrode 7 on the piezoelectric substrate 5.

Note that, as described above, strictly speaking, the SAW resonator 1 includes the piezoelectric substrate 5. However, as will be explained later, in the present embodiment, one piezoelectric substrate 5 is provided with a plurality of combinations of the IDT electrode 7 and the pair of reflectors 9, whereby a plurality of SAW resonators 1 (1S2, 1M1, etc.) are configured (see FIG. 2). Therefore, in the following explanation, for convenience, a combination of the IDT electrode 7 and one reflector 9 (electrode part in the SAN resonator 1) will be referred to as a "SAN resonator 1".

The piezoelectric substrate 5 is for example configured by a single crystal having a piezoelectric characteristic. The single crystal is for example a lithium niobate ($LiNbO_3$) single crystal or lithium tantalate ($LiTaO_3$) single crystal. The cut angle may be suitably set in accordance with the type of the SAN which is utilized and the like. For example, the piezoelectric substrate 5 is a rotated Y-out and X-propagating one. That is, the X-axis is parallel to the upper surface (D1 axis) of the piezoelectric substrate 5, and the Y-axis is inclined relative to the normal line of the upper surface of the piezoelectric substrate 5 at a predetermined angle. Note that, the piezoelectric substrate 5 may be one which is formed relatively thin and to which a support substrate made of an inorganic material or organic material is attached at the back surface (surface on the negative side of the D3 axis) as well. Further, an intermediate layer may be interposed between the piezoelectric substrate 5 and the support substrate as well. The intermediate layer may be a single layer or a plurality of layers stacked together.

The IDT electrode 7 and reflectors 9 are configured by layer-shaped conductors which are provided on the piezoelectric substrate 5. The IDT electrode 7 and reflectors 9 are for example configured by mutually the same materials to mutually the same thicknesses. The layer-shaped conductors configuring them are for example metal. The metal is for example Al or an alloy containing Al as the principal ingredient (Al alloy). The Al alloy is for example an Al—Cu alloy. The layer-shaped conductor may be configured by a plurality of metal layers as well. The thickness of the layer-shaped conductor is suitably set in accordance with the electrical characteristics etc. demanded from the SAW resonator 1. As one example, the thickness of the layer-shaped conductor is 50 nm to 600 nm.

The IDT electrode 7 has a pair of comb-shaped electrodes 11 (hatching is attached to one for convenience in order to improve the visibility). Each comb-shaped electrode 11 has a bus bar 13, a plurality of electrode fingers 15 which extend alongside each other from the bus bar 13, and a plurality of dummy electrodes 17 which project from the bus bar 13 between two or more electrode fingers 15.

The pair of comb-shaped electrodes 11 are arranged so that the pluralities of electrode fingers 15 intermesh (intersect) with each other. That is, the two bus bars 13 in the pair of comb-shaped electrodes 11 are arranged so as to face each other, and the electrode fingers 15 in one comb-shaped electrode 11 and the electrode fingers 15 in the other comb-shaped electrode 11 are basically alternately arranged in the width direction thereof. Further, the tip ends of the plurality of dummy electrodes in one comb-shaped electrode 11 face the tip ends of the electrode fingers 15 in the other comb-shaped electrode 11.

The bus bars 13 are for example substantially formed in long shapes so as to linearly extend in the direction of propagation of the SAW (D1 axis direction) with constant widths. Further, the pair of bus bars 13 face each other in the direction (D2 axis direction) perpendicular to the direction of propagation of the SAW. The mutually facing edge parts of the pair of bus bars 13 are for example parallel to each other. Note that, the bus bars 13 may change in the widths or may be inclined relative to the direction of propagation of the SAW.

The electrode fingers 15 are for example schematically formed in long shapes so as to linearly extend in the direction (D2 axis direction) perpendicular to the direction of propagation of the SAN with constant widths. The pluralities of electrode fingers 15 are for example arranged in the direction of propagation of the SAW. Further, they have equal lengths as each other. Note that, the IDT electrode 7 may be so-called apodized so that the lengths of the pluralities of electrode fingers 15 (from another viewpoint, intersecting widths) change in accordance with the positions in the direction of propagation as well.

The number, length, and width "w" (from another viewpoint, the duty ratio of the ratio of the width "w" relative to the pitch "p") of the electrode fingers 15 may be suitably set in accordance with the electrical characteristics etc. demanded from the SAN resonator 1. Note that, FIG. 1 etc. are schematic views, therefore a smaller number of electrode fingers 15 are shown. In actuality, a larger number of (for example 100 or more) electrode fingers 15 than the shown ones may be arranged. The same is true for the strip electrodes 21 in the reflectors 9 which will be explained later.

A pitch "p" of the plurality of electrode fingers 15 (electrode finger pitch) is for example made substantially constant over the entire IDT electrode 7. Note that, the pitch "p" is for example a distance between the centers of mutually adjacent two electrode fingers 15 (or strip electrodes 21 which will be explained later). The pitch "p" is basically made a half of a wavelength "λ" (p=λ/2) of the SAN having an equal frequency to the frequency at which resonance is intended to be caused in the SANs propagating on the piezoelectric substrate 5.

The pluralities of dummy electrodes 17 are for example substantially formed in long shapes so as to linearly project in the direction (D2 axis direction) perpendicular to the direction of propagation of the SAN with constant widths. The widths, number, and pitch of the plurality of dummy electrodes 17 are equal to those of the plurality of electrode fingers 15. Note that, the widths of the dummy electrode 17 may be different from those of the electrode fingers 15 as well. The IDT electrode 7 may be one without dummy electrodes 17. In the following explanation, sometimes explanation and illustration of the dummy electrodes 17 will be omitted.

As already explained, the tip ends of the plurality of electrode fingers 15 in one comb-shaped electrode 11 and the other comb-shaped electrode 11 (in more detail, the tip ends of the dummy electrodes 17 in the other comb-shaped electrode 11 in the present embodiment) face across a gap Gp in a direction of extension of the pluralities of electrode fingers 15 (D2 axis direction). The size of the gap Gp in the D2 axis direction is for example equal among the pluralities of electrode fingers 15.

The reflectors 9 are for example formed in lattice shapes. That is, the reflectors 9 have pairs of bus bars 19 which face each other and pluralities of strip electrodes 21 which extend between the pairs of bus bars 19.

The shapes of the bus bars 19 and strip electrodes 21 may be made equal to those of the bus bars 13 and electrode fingers 15 in the IDT electrode 7 except that the two ends of the strip electrodes 21 are connected to the pairs of bus bars 19.

The pair of reflectors 9 are for example adjacent to the two sides of the IDT electrode 7 in the direction of propagation of the SAW. Accordingly, the pluralities of strip electrodes 21 are arranged continuing from the arrangement of the pluralities of electrode fingers 15. The pitch between the strip electrodes 21 and the electrode fingers 15 which are adjacent to each other between the reflectors 9 and the IDT electrode 7 is for example equal to the pitch of the plurality of electrode fingers 15 (and plurality of strip electrodes 21).

Note that, the upper surface of the piezoelectric substrate 5 may be covered by a not shown protective film made of S12 or the like from the tops of the IDT electrode 7 and reflectors 9 as well. This protective film may be thinner or thicker than the IDT electrode 7. Further, in a case where the protective film is provided or the like, on the upper surfaces or lower surfaces of the IDT electrode 7 and reflectors 9, additional films made of an insulator or metal may be provided in order to improve the reflection coefficient of the SAN as well.

When a voltage is supplied to the pair of comb-shaped electrodes 11, the voltage is supplied to the piezoelectric substrate 5 by the electrode fingers 15, and a SA in a predetermined mode propagating in the D1 axis direction along the upper surface is excited in the vicinity of the upper surface of the piezoelectric substrate 5. The excited SAW is mechanically reflected by the electrode fingers 15. As a result, a standing wave having the pitch of the electrode fingers 15 as a half wavelength is formed. The standing wave is converted to an electrical signal having the same frequency as that of the standing wave and is extracted by the electrode fingers 15. In this way, the SAN resonator 1 functions as a resonator. The resonance frequency thereof is substantially the same frequency as the frequency of the SAN propagating on the piezoelectric substrate 5 having the electrode finger pitch as a half wavelength.

The SAN excited in the IDT electrode 7 is mechanically reflected by the strip electrodes 21 in the reflectors 9. Further, the mutually adjacent strip electrodes 21 are connected to each other by the bus bars 19, therefore the SAN from the IDT electrode 7 is reflected by the strip electrodes 21 in terms of electricity as well. Due to this, divergence of SAW is suppressed and a strong standing wave stands in the IDT electrode 7, therefore the function of the SAW resonator 1 as a resonator is improved.

Note that, when referring to "connection" for the SAN resonator 1, as schematically shown by the two terminals 3, unless otherwise particularly explained, it means connection in a mode by which voltage is supplied to the pair of comb-shaped electrodes 11.

In the IDT electrode 7, for improvement or fine adjustment of the characteristics, sometimes a pitch "p" having a different size from the pitch "p" of the major part is set in a portion thereof (for example less than 50% or less than 5% of the total number of the pitch "p"). For example, in the IDT electrode 7, sometimes a narrow pitch part having a smaller pitch "p" than those of the other major part is provided on the two sides in the direction of propagation of the SAN. Further, for example, sometimes a predetermined number of (for example 1 to 3) alternately arranged electrode fingers 15 of the pair of comb-shaped electrodes 11 are removed. Alternatively, the change of the width "w" or arrangement of the electrode fingers 15 which is substantially equivalent to the above removing is executed. That is, sometimes thinning is carried out. In the present disclosure, when referring to the pitch "p", width "w", or duty ratio (w/p), such a special portion will not be considered unless particularly explained otherwise. Further, if the pitch "p" or the width "w" fluctuates in a very small range over the entire IDT electrode 7, a mean value thereof may be used.

(Outline of SAW Filter)

Figure 2:
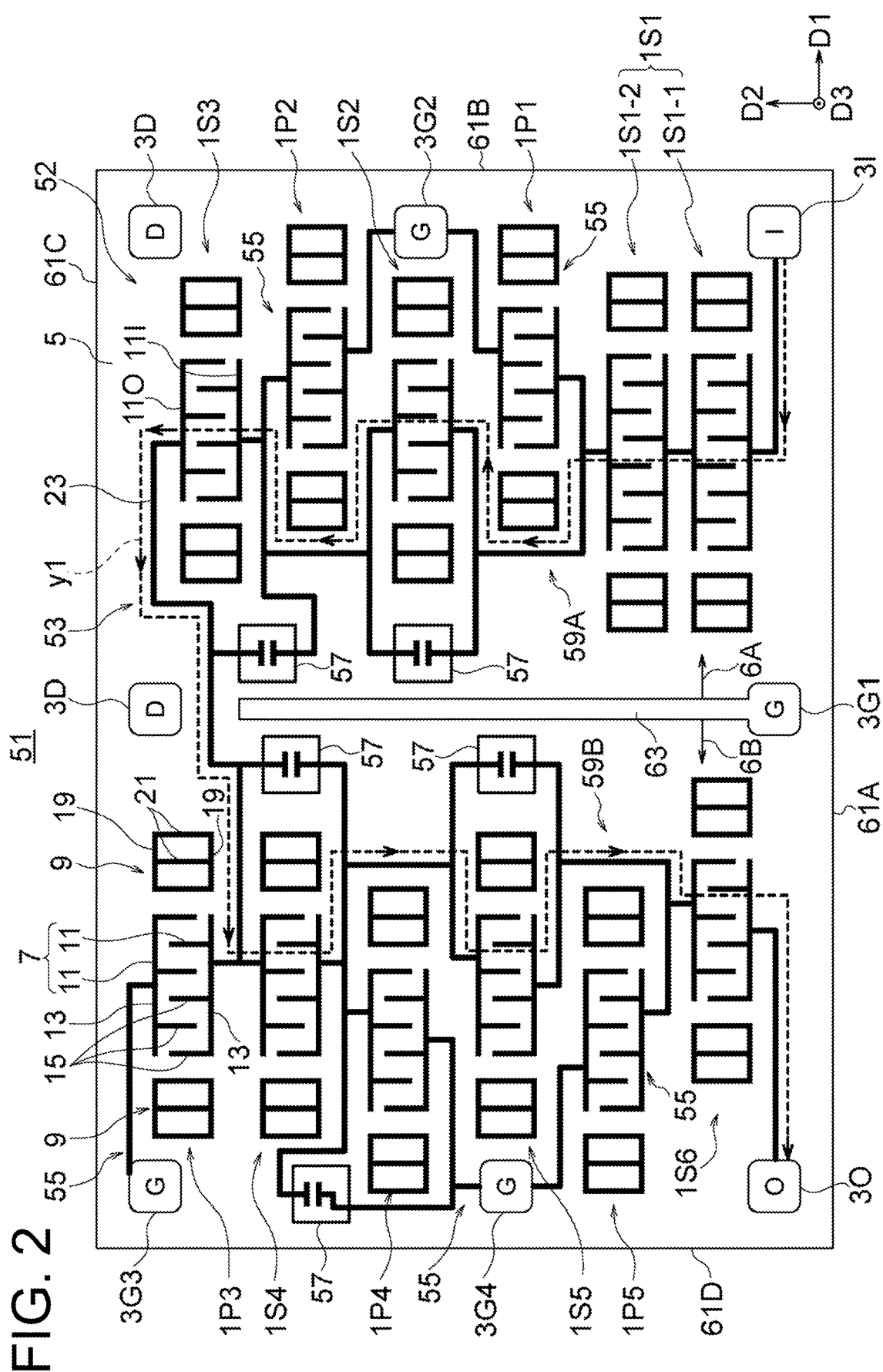
FIG. 2 is a plan view schematically showing the configuration of a SAN filter including the SAN resonator in FIG. 1.

FIG. 2 is a plan view schematically showing the configuration of a SAN filter 51 including the SAN resonator 1. In this view, as will be understood from the notations of the IDT electrode 7 and reflectors 9 shown on the left top side on the drawing sheet, these conductors are shown furthermore schematically than those in FIG. 1.

The SAN filter 51 has the already explained piezoelectric substrate 5. Further, the SAW filter 51, on the piezoelectric substrate 5, has various terminals (3I and 3O etc.) to or from which signals are input or output, a filter body 52 filtering signals, and a shield conductor 63 contributing to improvement of the characteristics of the filter body 52.

The plurality of terminals include for example an input terminal 3I receiving as input an electrical signal from an external portion of the SAN filter 51, an output terminal 3O outputting the electrical signal to the external portion, a first GND terminal 3G1 to fourth GND terminal 3G4 given reference potentials from the external portion, and boding-use dummy terminals 3D. Note that, the SAW filter 51 may be one capable of using the input terminal 3I as the output terminal and using the output terminal 3O as the input terminal as well.

Note that, for easier illustration, letters of "I", "O", "G", or "D" are attached to these terminals. Further, sometimes these terminals will not be differentiated, but will be simply referred to as the "terminals 3". The first GND terminal 3G1 to the fourth GND terminal 3G4 will be sometimes simply referred to as the "GND terminals 3G" and will not be differentiated. The input terminal 3I and output terminal 3O and/or GND terminal 3G for example correspond to the terminals 3 shown in FIG. 1.

The filter body 52 is configured so as to filter an electrical signal from the input terminal 3I and output the result to the output terminal 3O. Further the filter body 52 is configured so as to allow unwanted components (signals out of the passing band) contained in the electrical signals to escape to the GND terminals 3G at the filtering described above.

The filter body 52 is configured so that the plurality of SAN resonators 1 (1S1 to 1S6 and 1P1 to 1P5 in the example shown) are connected in a ladder shape among the input terminal 3I, the output terminal 3O, and one or more GND terminals 3G. The plurality of terminals 3 and plurality of SAN resonators 1 are connected by a plurality of wirings 23.

Note that, the package and/or mounting structure of the SAW filter 51 may be made various forms. For example, the packaging or mounting is carried out by the SAN filter 51 being arranged so that the upper surface (surface on the +D3 side) of the piezoelectric substrate 5 faces a not shown circuit board and by the various types of terminals 3 described above and pads on the circuit board being bonded by bumps. Otherwise, for example, on the upper surface of the piezoelectric substrate 5, a not shown box-shaped cover is covered, and not shown columnar conductors penetrating through the cover are provided on the various types of terminals 3. Further, the SAW filter is arranged so that the upper surface of the cover faces the not shown circuit board and is mounted by bonding of the columnar conductors which are exposed from the upper surface of the cover and the pads on the circuit board by the bumps.

(Terminals and Wirings)

The terminals 3 and wirings 23 are configured by conductor layers positioned on the upper surface of the piezoelectric substrate 5. The conductor layers are for example the same (same materials and thicknesses) as those of the conductor layers configuring the IDT electrode 7 and reflectors 9. However, at the position of the terminal 3, on the conductor layer common to the IDT electrode 7 and reflectors 9 and wirings 23, a conductor layer made of another material may be formed as well. Naturally, the terminal 3, wirings 23, and other conductor layers may be configured by mutually different materials as well.

The shapes and dimensions etc. of the terminals 3 may be suitably set. Note that, the terminals 3 need not be able to be differentiated from the wirings 23 based on configurations (shapes or materials etc.) of themselves. That is, the terminals may become like parts of the wirings 23. For example, the positions or ranges of the terminals 3 may be specified according to the insulation layer which covers the wirings 23 but does not cover the terminal 3 or may be specified according to members (for example bumps) which abut against the terminals 3 when the piezoelectric substrate 5 is packaged.

In the example shown, none of the GND terminals 3G are short-circuited with each other. For example, all GND terminals 3G (3G2 to 3G4) connected with the filter body 52 are connected through the filter body 52 (from another viewpoint, the SAN resonator 1 or other electronic elements), but are not connected only by the wirings 23 (and/or wirings of not shown package or the like). Note that, as the electronic element, other than the SAN resonator 1, for example, there can be mentioned a resistor, capacitor, or inductor. The wirings 23, strictly speaking, have resistance value, capacitance, and inductance. However, they are not considered here. Note that, all GD terminals 3G connected with the filter body 52 may be short-circuited in whole or in part unlike the example shown.

The dummy terminals 3D are for example terminals which are utilized for bonding at the packaging or mounting of the SAN filter 51. In only the SAW filter 51, for example, they are rendered an electrically floating state. Note that, the dummy terminals 3D may be given the reference potentials when the SAW filter 51 is mounted or may be connected with the GND terminals 3G through a not shown cover which covers the filter body 52. Further, such dummy terminals 3D need not be provided either.

The specific routes and widths etc. of the wirings 23 may be suitably set. In FIG. 2, for convenience, the wirings 23 are shown with constant widths or relatively thin. However, the wirings 23 may change in width, may be formed relatively wide as shown in FIG. 1, or may have equal widths to the lengths (D1 axis direction) of the bus bars 13 in part. Further, in FIG. 2, for convenience, the wirings 23 are laid parallel to the D1 axis direction or D2 axis direction. However, they may be inclined in the D1 axis direction or D2 axis direction as well. In the example shown, the wirings 23 do not overlap each other. However, there may be a portion where the wirings 23 three-dimensionally cross each other with an insulator interposed therebetween as well.

(Connection Relationships of SAN Resonators in Filter Body)

The filter body 52 is configured by a so-called ladder-type SAN filter. That is, the filter body 52 has a serial arm 53 (an arrow y1 is shown along the serial arm 53) which connects the input terminal 3I and the output terminal 3O and has one or more (two or more (five) in the example shown) parallel arms 55 which connect the serial arm 53 and the GND terminals 3G. The serial arm 53 contributes to transmission of signals in the passing band. The parallel arms 55 contribute to flow of the signals out of the passing band to the GND terminals 3G. Note that, in the explanation of the present embodiment, basically an example where the number of the parallel arms 55 is two or more will be taken as an example.

The serial arm 53 includes a first serial resonator 1S1 to sixth serial resonator 1S6 (below, sometimes they will be simply referred to as the "serial resonators 1S" and will not be differentiated) connected in series between the input terminal 3I and the output terminal 3O. The parallel arms 55 have a first parallel resonator 1P1 to fifth parallel resonator 1P5 (below, sometimes they will be simply referred to as the "parallel resonators 1P" and will not be differentiated) each of which connecting the input side (input terminal 3I side) or output side (output terminal 3O side) of any serial resonator 1S and the GND terminal 3G. The plurality of parallel arms 55 (parallel resonators IP) are connected at electrically mutually different positions with respect to the serial arm 53 (positions where the relative relationships relative to the serial resonator 1S are different from each other).

Note that, in the explanation of the present embodiment, when referring to the serial arm 53 (from another viewpoint, one or more serial resonators 1S) and the parallel arms 55 (from another viewpoint, one or more parallel resonators 1P) being connected in a ladder shape, as described above, it designates a state where the serial arm 53 (from another viewpoint, one serial resonator or a plurality of serial resonators 1S which are connected in series) is connected between the input terminal 3I and the output terminal 3O and one or more parallel arms 55 (from another viewpoint, one or more parallel resonators 1P) are connected between the input side or output side of one or more serial resonators 1S and the GND terminals 3G.

The number of the serial resonators 1S and the number of the parallel resonators 1P may be suitably set. The numbers shown in FIG. 2 are only one example. In the example shown, the parallel resonator 1P is not connected to the input side of the first serial resonator 1S1 which is closest to the input terminal 3 side. However, the parallel resonator IP may be connected to the input side of the first serial resonator 1S1 as well. In the same way, the parallel resonator 1P is not connected to the output side of the sixth serial resonator 1S6 which is closest to the output terminal 3O side. However, the parallel resonator 1P may be connected to the output side of the sixth serial resonator 1S6 as well.

The plurality of parallel resonators 1P may be individually (one-to-one) connected to the plurality of GND terminals 3G which are not short-circuited with each other. Alternatively, all or part thereof may be connected to the same GND terminal 3G or the plurality of GND terminals 3G which are short-circuited with each other. In the example shown, two of the first parallel resonator 1P1 and the second parallel resonator 1P2 are connected to the second GND terminal 3G2, two of the fourth parallel resonator 1P4 and the fifth parallel resonator 1P5 are connected to the fourth GND terminal 3G4, and the third parallel resonator 1P3 is connected to the third GND terminal 3G3.

Each of the serial resonators 1S and parallel resonators 1P is for example configured by the SAN resonator 1 which was explained with reference to FIG. 1. However, specific values of the number of the electrode fingers 15, the length of the electrode fingers 15 and/or pitch "p" and the like are set in accordance with the characteristics demanded from each of the resonators.

Each of the serial resonators 1S and parallel resonators 1P may be configured by one SAN resonator 1 or may be configured by a plurality of SAN resonators 1. In the example shown, the first serial resonator 1S1 is configured by two SAN resonators 1 (first divided resonator 181-1 and second divided resonator 181-2), while resonators other than that are configured by single SAN resonators 1. Note that, from another viewpoint, the first serial resonator 1S1 may be grasped as one SAN resonator 1 divided into a plurality of (here, two) SAN resonators 1 as well.

The first divided resonator 181-1 and the second divided resonator 1S1-2 are connected in series to each other. They may be connected by a wiring 23 or by the bus bars 13 of the two being shared. The first divided resonator 1S1-1 and the second divided resonator 1S1-2 are for example given substantially the same configurations as each other. However, the two may be given mutually different configurations as well.

In this way, by dividing one serial resonator 1S or one parallel resonator 1P, for example, the voltage supplied to one SAN resonator 1 (here, first divided resonator 1S1-1 or second divided resonator 1S1-2) is lowered, therefore the electrical power resistance in one serial resonator 1S as a whole or one parallel resonator 1P as a whole can be improved. In a case where the SAN filter 51 is a transmission filter (explained later) utilized for wireless communications, compared with the output terminal 3O side, the strength of the electrical signal is high on the input terminal 3I side. In this case, as in the example shown, by dividing the SAN resonator 1 which is closest to the input terminal 3I, the electrical power resistance of the entire SAN filter 51 can be improved.

Note that, in a case where a plurality of serially connected SAN resonators 1 are provided in the serial arm 53, for example, whether each SAN resonator 1 is a divided resonator or one solely configuring the serial resonator 1 may be specified based on the connection position with the parallel arm 55. For example, unless the parallel arm 55 is connected between two SAN resonators 1 which are connected in series to each other, the two SAN resonators 1 may be regarded as divided resonators which configure one serial resonator 1S together.

(Connection of Capacitor Element)

The SAW filter 51 for example has one or more capacitor elements 57 which are connected in parallel with respect to all or part of the plurality of SAN resonators 1 (in the example shown, 1B2, 13, 1P4, and 1P5). Note that, in FIG. 2, the capacitor element 57 is represented by a frame (rectangular shape) showing a region where it is arranged and a notation indicating the capacitor element.

By providing the capacitor elements 57 connected in parallel to the SAW resonators 1, for example, a difference of (explained later, see FIG. 3) between the resonance frequency and the antiresonance frequency in the SAN resonator 1 can be made small. As a result, for example, a filter characteristic with a pass characteristic steeply changing at a boundary between the passing band and the outside thereof can be obtained. Note that, the SAN filter 51 need not have a capacitor element 57.

The capacitor element 57 may be provided with respect to any resonator 1 in the SAN filter 51 as well. Further, any number may be provided. One capacitor element 57 may for example be provided with respect to one SAN resonator 1. However, a capacitor element 57 may be provided in common with respect to a plurality of SAN resonators 1 as well. For the divided resonators (1S1-2 and 1S1-2) as well, in the same way, the capacitor element 57 may be individually provided or may be provided in common for a plurality of divided resonators.

The capacitor elements 57 are for example configured by conductor layers on the piezoelectric substrate 5. The conductor layers are for example the same conductor layers as the conductor layers configuring the IDT electrode 7. The capacitor element 57 may be one configured by a pair of parallel electrodes with linear edge parts facing parallel to each other or may be one configured by a pair of mutually intermeshing comb-shaped electrodes. Note that, the facing direction of the pair of parallel electrodes or the bus bars in the pair of comb-shaped electrodes may be any direction parallel to the upper surface of the piezoelectric substrate 5.

Note that, although not particularly shown, the SAN filter 51, other than what is described above, may have a capacitor and/or inductor at a suitable position as well. For example, the SAN filter 51 may have a capacitor and/or inductor which is connected in series between the parallel resonator 1P and the GND terminal 3G as well. The combination of such a capacitor and/or inductor and the SAN resonator 1 (serial resonator 1S or parallel resonator 1P) may be grasped as a serial resonator or parallel resonator as well.

(Shape of Route of Serial Arm)

The SAN filter 51, as understood from an arrow y1 attached along the serial arm 53, is configured such that the serial arm 53 is folded back on the piezoelectric substrate 5 in the middle (is configured in a substantially U-shape). In other words, the serial arm 53 includes the first divided arm 59A extending from one side (−D2 side) of the predetermined direction (D2 axis direction) on the piezoelectric substrate 5 to the other side (+D2 side), and a second divided arm 59B folded back from the other side (+D2 side) of the first divided arm 59A and extending to the one side (−D2 side) (hereinafter, sometimes they are simply referred to as "divided arms 59", and not distinguished.). Specifically, these configurations are for example as follows.

The piezoelectric substrate 5 is for example configured in a schematically rectangular shape when viewed on a plane and has four sides. The side on the −D2 side is defined as a first side 61A, the side on the +D1 side is defined as a second side 61B, the side on the +D2 side is defined as a third side 61C, and the side on the −D1 side is defined as a fourth side 61D.

The input terminal 3I and output terminal 3O are for example positioned closer to the same one side (first side 61A) from the center of the piezoelectric substrate 5. Further, for example, they are adjacent to the first side 61A. Further, for example, the input terminal 3I and the output terminal 3O are positioned closer to a pair of opposite sides (second side 61B and fourth side 61D) from the center of the piezoelectric substrate 5, the pair of opposite sides being on the two sides of the first side 61A which the terminals adjoin. Further, for example, they are adjacent to the second side 61B and the fourth side 61D.

Note that, the "adjacent" referred to here designates for example a state where another terminal 3 or SAN resonator 1 is not positioned between the terminal 3 and one side and/or state where the distance (shortest distance) between the terminal 3 and one side is smaller than the diameter (for example maximum diameter) of the terminal 3. Note that, between one side and the terminal adjacent to the one side, for example, an annular conductor pattern (shield-use and/or bonding-use) extending along the outer edge of the piezoelectric substrate 5 may be positioned as well.

The first divided arm 59A schematically extends from the input terminal 3I toward the +D2 side (third side 61C side, the third side 61C being the opposite side to the first side 61A) and reaches the folded back portion (connection portion of the first divided arm 59A and the second divided arm 59B). The second divided arm 59B schematically extends from the folded back portion toward the −D2 side (first side 61A side) and reaches the output terminal 3O. The folded back portion is for example configured by the wiring 23 connecting the two serial resonators 1 and is positioned relatively close to the third side 61C. For example, a portion of this wiring 23 is adjacent to the third side 61C. The term "adjacent" is the same as the "adjacent" between the terminal 3 and one side described above.

The first divided arm 59A, for example, is positioned on the piezoelectric substrate 5 in a first divided region 6A which is closer to the +D2 side than a predetermined position. Further, the second divided arm 59B, for example, is positioned on the piezoelectric substrate 5 in a second divided region 6B which is closer to the −D2 side than the predetermined position. Note that, in the following description, sometimes the first divided region 6A and the second divided region 6B will be simply referred to as the "divided regions 6" and the two will not be differentiated. The predetermined position described above is for example substantially the center of the major surface of the piezoelectric substrate 5. The "substantially center" is for example a position where the distance in the D1 axis direction from the center of the major surface of the piezoelectric substrate 5 (center of the figure, center of gravity of the figure) is not more than 10% of the length of the piezoelectric substrate 5 in the D1 axis direction.

As shown by the notations attached on the right side on the drawing sheet in FIG. 2, between the pair of comb-shaped electrodes 11 in the serial resonator 1S, the comb-shaped electrode 11 positioned on the input terminal 3I side (input side, one side) from the viewpoint of the flow of the electrical signal will be defined as the input side comb-shaped electrode 11I, and the comb-shaped electrode 11 positioned on the output terminal 3O side (output side, the other side) from the viewpoint of the flow of the electrical signal will be defined as the output side comb-shaped electrode 11O. That is, in the pair of comb-shaped electrodes 11, the one which is connected with the input terminal 3I through or not through the other serial resonator 1S is the input side comb-shaped electrode 11I. In the pair of comb-shaped electrodes 11, the one which is connected with the output terminal 3O through or not through the other serial resonator 1S is the output side comb-shaped electrode 11O. Further, the orientation in the D2 axis direction from the bus bar 13 in the input side comb-shaped electrode 11I to the bus bar 13 in the output side comb-shaped electrode 11O will be sometimes referred to as the orientation etc. from the input side comb-shaped electrode 11I to the output side comb-shaped electrode 11O relative to the piezoelectric substrate 5.

The first divided arm 59A has one or more (two or more in the example shown) serial resonators 1S (1S1 to 1S3). Further, the second divided arm 59B has one or more (two or more in the example shown) serial resonators 1S (1S4 to 1S6). Further, in the serial resonator 1S in the first divided arm 59A, the orientation from the input side comb-shaped electrode 11I to the output side comb-shaped electrode 11O relative to the piezoelectric substrate 5 becomes the +D2 direction (direction from the input terminal 3I to the folded back position, the direction from the first side 61A to the third side 61C). On the other hand, in the serial resonator 1S in the second divided arm 59B, the orientation from the input side comb-shaped electrode 11I to the output side comb-shaped electrode 11O relative to the piezoelectric substrate 5 becomes the −D2 direction (direction from the folded back position to the input terminal 3O, the direction from the third side 61C to the first side 61A). That is, the orientation from the input side comb-shaped electrode 11I to the output side comb-shaped electrode 11O relative to the piezoelectric substrate 5 is inverse between the first divided arm 59A and the second divided arm 59B.

In each divided arm 59, the plurality of serial resonators 1S are for example arranged in the D2 axis direction in their connection order. For example, in each divided arm 59, when focusing on the two serial resonators 1S which are connected to each other without going through another serial resonator 1S, the serial resonator 1S on the output side (output terminal 3O side), relative to the serial resonator 1S on the input side, is positioned in a direction of extension of that divided arm 59 (from another viewpoint, the direction from the input side comb-shaped electrode 11I to the output side comb-shaped electrode 11O). That is, the output side serial resonator 1S is positioned closer to the +D2 side relative to the input side serial resonator 1S in the first divided arm 59A, while the output side serial resonator 1S is positioned closer to the −D2 side relative to the input side serial resonator 1S in the second divided arm 59B.

In other words, in each divided arm 59, the serial resonator 1S on the input side and the serial resonator 1S on the output side do not overlap with each other in a range where they are arranged in the D2 axis direction. On the other hand, at least single portions in the range where they are arranged in the D1 axis direction overlap with each other. Further, for example, in each divided arm 59, none of the serial resonators 1S overlap in a range where they are arranged in the D2 axis direction, while at least single portions overlap with each other in the range where they are arranged in the D1 axis direction.

Note that, so far as the first divided arm 59A includes at least one serial resonator 1S and so far as the output side portion of the first divided arm 59A as a whole (here, the bus bar 13 of the output side comb-shaped electrode 11O in the third serial resonator 1S3) is positioned closer to the +D2 side relative to the input side portion (here, the connection portion of the wiring 23 with the input terminal 3I or the bus bar 13 of the input side comb-shaped electrode 11I in the first serial resonator 1S1-1), it may be said that the first divided arm 59A extends toward the +D2 side. In the same way, so far as the second divided arm 59B includes at least one serial resonator 1S and so far as the output side portion of the second divided arm 59B as a whole (here, the connection portion of the wiring 23 with the output terminal 3O or the bus bar 13 of the output side comb-shaped electrode 11O in the sixth serial resonator 1S6) is positioned closer to the −D2 side relative to the input side portion (here, the bus bar 13 of the input side comb-shaped electrode 11I in the fourth serial resonator 14), it may be said that the second divided arm 59B extends toward the −D2 side.

Accordingly, for example, each divided arm 59 may include a serial resonator 1S with an orientation from the input side comb-shaped electrode 11I toward the output side comb-shaped electrode 11O relative to the piezoelectric substrate 5 different from that explained above as well. Further, for example, in each divided arm 59, two serial resonators 1S may overlap each other in at least single portions in the range where they are arranged in the D2 axis direction. Further, for example, on the input side or output side of the two divided arms 59, the serial arm 53 may include a serial resonator 1S which is not included in the two divided arms 59. Further, for example, the input terminal 3I and the output terminal 3O may be different from each other in the positions in the direction of extension of the electrode fingers 15 (D2 axis direction).

(Positions of Arrangement on Piezoelectric Substrate of Components Connected to Serial Arm)

As explained above, for example, a plurality of parallel arms 55 and plurality of capacitor elements 57 are connected to the serial arm 53. These plurality of components are also arranged divided into the first divided region 6A on the first divided arm 59A side (+D1 side) and the second divided region 6B on the second divided arm 59B side (−D1 side) on the piezoelectric substrate 5 along with the serial arm 53 extending so as to be folded back. Specifically, this is as follows.

(Positions of Arrangement of Parallel Resonators on Piezoelectric Substrate)

The plurality of parallel resonators 1P, for example, are arranged on the piezoelectric substrate 5 along the route from the input side to the output side of the serial arm 53 in the order from the one electrically closest to the input terminal 3I. As a result, for example, when considering the arrangement of the plurality of parallel resonators 1P in the order from the one electrically closest to the input terminal 3I, the plurality of parallel resonators 1P are schematically arranged so as to be folded back in the same way as the serial arm 53. In other words, the plurality of parallel resonators 1P are divided into an arrangement along the first divided arm 59A (arrangement in the first divided region 6A) and an arrangement along the second divided arm 59B (arrangement in the second divided region 6B).

Note that, the orientation in each parallel resonator 1P from the comb-shaped electrode 11 connected to the serial arm 53 to the comb-shaped electrode 11 connected to the GND terminal 3G relative to the piezoelectric substrate 5 may be suitably set. For example, the above orientations need not to be unified in each divided region 6.

In each divided arm 59, the serial resonator 1S and the parallel resonator 1P are for example alternately arranged in the D2 axis direction in an order of connection of the same. For example, in each divided arm 59, the parallel resonator 1P connected to the output side of the serial resonator 1S is positioned relative to that serial resonator 1S in the direction of extension of that divided arm 59 (from another viewpoint, the direction from the input side comb-shaped electrode 11I to the output side comb-shaped electrode 11O in that serial resonator 1S). Further, in each divided arm 59, the parallel resonator 1P connected to the input side of the serial resonator 1S is positioned relative to that serial resonator 1S in the inverse direction to the direction of extension of that divided arm 59 (from another viewpoint, the direction from the output side comb-shaped electrode 11O to the input side comb-shaped electrode 11I in that serial resonator 1S).

Note that, in the parallel resonator 1P connected to the folded back position (in the example shown, 1P3), only one of the two ways described above stands. In a case where provision is made of a parallel resonator 1P which is connected to the input terminal 3I or output terminal 3O without going through a serial resonator 1S, for example, only one of the two ways described above stands for this parallel resonator 1P as well.

For the alternate arrangement described above, in other words, in each divided arm 59, the serial resonator 1S and the parallel resonator 1P which is connected to the input side or output side of the former do not overlap each other in the range where they are arranged in the D2 axis direction. On the other hand, at least single portions thereof overlap each other in the range where they are arranged in the D1 axis direction. Further, for example, in each divided arm 59, none of the serial resonators 1S and none of the parallel resonators 1P overlap in the range where they are arranged in the D2 axis direction, while at least single portions overlap each other in the range where they are arranged in the D1 axis direction.

In each divided arm 59, for example all of the arrangement positions on the piezoelectric substrate 5 of the plurality of parallel resonators 1P excluding the third parallel resonator 1P3 are offset to the side opposite to the other divided arm 59 (from another viewpoint, the outer side in the D1 axis direction of the piezoelectric substrate 5) relative to the adjacent serial resonators 1S. This offset may be judged according to for example mutual comparison of the positions of the end parts of the serial resonator 1S and the parallel resonator 1P on the other divided arm 59 side (for example the positions of the end parts on the −D1 side in the first divided arm 59A), mutual comparison of center positions in the D1 axis direction of the resonators, and/or the positions of the end parts of the resonators on the side opposite to the other divided arm 59. Note that, the third parallel resonator 1P3 may be offset in the same way as the other parallel resonators 1P. Conversely, the other parallel resonators 1P need not be offset like described above.

The wiring 23 connecting the serial resonators 1S in each divided arm 59, for example, passes on the piezoelectric substrate 5 on the other divided arm 59 side of the parallel resonator 1P (from another viewpoint, the center side in the D1 axis direction on the piezoelectric substrate 5). Further, the wiring 23 connecting the parallel resonator 1P and the GND terminal 3G according to each divided arm 59, for example, schematically extends on the piezoelectric substrate 5 from the parallel resonator 1P toward the opposite side to the other divided arm 59 (from another viewpoint, toward the outer side of the D1 axis direction of the piezoelectric substrate 5). For the serial resonators 1S in at least a portion (in the example shown, 1S2 and 1S5) in at least one divided arm 59, for example, the GND terminal 3G is positioned on the opposite side of this serial resonator 1S relative to the other divided arm 59, and the both of the wirings 23 from the two parallel resonators 1P on the input side and output side of this serial resonator 1S are connected to this GND terminal 3G.

(Position of Arrangement of Capacitor Element)

The capacitor element 57 which is connected to the serial resonator 1S or parallel resonator 1P in the first divided region 6A is for example arranged in the first divided region 6A. In the same way, the capacitor element 57 which is connected to the serial resonator 1S or parallel resonator 1P in the second divided region 6B is for example arranged in the second divided region 6B.

In each divided region 6, the position of arrangement on the piezoelectric substrate 5 of at least part of the capacitor elements 57 is for example positioned on the other divided arm 59 side relative to the divided arm 59 in that divided region 6 (from another viewpoint, the center side in the D1 axis direction of the piezoelectric substrate 5). In the example shown, all of the capacitor elements 57 which are positioned on the other divided arm 59 side are the capacitor elements 57 which are connected in parallel with respect to the serial resonators 1S. Further, the capacitor elements 57 are for example positioned on the other divided arm 59 side relative to any one or more serial resonators 1S or parallel resonators 1P. Note that, the capacitor element 57 may be simply positioned on the other divided arm 59 side relative to the wiring 23 in the serial arm 53 as well (the capacitor element and the serial resonator 1S may overlap each other in at least single portions in the range where they are arranged in the D1 axis direction as well).

The capacitor element 57 in the first divided arm 59A and the capacitor element 57 in the second divided arm 59B for example do not mutually overlap in the range where they are arranged in the D1 axis direction. However, at least single portions of the two may mutually overlap in the range where they are arranged in the D1 axis direction. Further, the two need not overlap with each other or parts or all may overlap with each other in a range where they are arranged in the D2 axis direction.

(Shield Conductor)

The shield conductor 63 is positioned between the two divided arms 59 and is connected to any of one more GND terminals 3G (3G1 in the example shown). By providing such a shield conductor 63, for example, a probability of mutual electromagnetic coupling of the two divided arms 59 can be reduced.

As already explained, not only the two divided arms 59, but also various types of components (1P, 57, and 23) connected to the serial arm 53 are arranged while being divided to the first divided region 6A on the first divided arm 59A side (+D1 side) and the second divided region 6B on the second divided arm 59B side (−D1 side). Further, the shield conductor 63 is positioned between the two regions and in turn positioned also among the above various components. Note that, it may be grasped that the major surface of the piezoelectric substrate 5 is divided into two divided regions 6 by the shield conductor 63 (the shield conductor 63 is a border line of the two divided regions 6) as well.

The shield conductor 63 has for example a portion which is positioned between at least one of the serial resonators 1S (1S1 to 1S3) included in the first divided arm 59A and at least one of the serial resonators 1S (14 to 1S6) included in the second divided arm 59B. In the example shown, the shield conductor 63 is positioned between each of all serial resonators 1i in one divided arm 59 and each of all serial resonators 1S in the other divided arm 59.

Note that, for the third serial resonator 1S3 and fourth serial resonator 1S4, the shield conductor 63 is positioned between single portions of the same. In other words, on the upper surface of the piezoelectric substrate 5, a straight line that does not intersect the shield conductor 63, but intersects the two of the third serial resonator 13 and fourth serial resonator 14 can be drawn. In this way, when referring to the shield conductor 63 being positioned between the two serial resonators 1S, the shield conductor 63 need not always be positioned so as to out off all of the two (it is not necessary that the straight line as described above cannot be drawn).

As already explained, the positions of arrangement on the piezoelectric substrate of part of the capacitor elements 57 which are connected to each divided arm 59 are positioned on the other divided arm 59 side relative to that divided arm 59. The shield conductor 63 for example includes a portion which is positioned on the other divided arm 59 side relative to that part of the capacitors 57. That is, part of the capacitor elements 57 are positioned between the divided arm 59 and the shield conductor 63. In more detail, for example, part of the capacitor elements 57 are positioned on the shield conductor 63 side relative to the serial resonators 1S and/or parallel resonators 1P.

The shield conductor 63 is for example configured by a conductor layer positioned on the upper surface of the piezoelectric substrate 5. The conductor layer for example may be the same as (same material and thickness) or different from the conductor layers configuring the IDT electrode 7, reflectors 9, wirings 23, and/or terminals 3. In the latter case, for example, the shield conductor 63 may be formed thicker than the conductor layers configuring the IDT electrode 7 and reflectors 9.

The shape and dimensions of the shield conductor 63 when viewed on a plane may be suitably set. In the example shown, the shield conductor 63 is substantially long in shape linearly extending with a constant width. The portion linearly extending with the constant width for example accounts for 80% or more of the area of the shield conductor 63. The size of the constant width is for example larger than the minimum width of the plurality of wirings 23.

However, the shield conductor 63 may be suitably bent and/or changed in width in accordance with the arrangements of the serial resonators 1S, parallel resonators 1P, capacitor elements 57, and/or wirings 23 etc. For example, the shield conductor 63 may linearly extend with a constant width in its major part (for example 80% or more of the area) while, in part, may be formed narrower in a part where the distance between the components (1S, 1P, 57, and/or 23 in the example shown) which are distributed in the direction of arrangement of the two divided arms 59 (D1 axis direction) becomes shorter. Further, for example, the shield conductor 63 may be formed broader in width at a position where the distance between the components which are distributed in the direction of arrangement of the two divided arms 59 is longer, so that the maximum limit of area may be secured.

The shield conductor 63 is given a reference potential. Therefore, for example, it may be directly or indirectly connected with the conductor given the reference potential in the filter body 52 as well. For example, the shield conductor 63 may be connected to the ID terminal 3G to which the parallel resonator 1P is connected, the GND terminal 3G to which the shield conductor 63 is connected and the GND terminal 3G to which the parallel resonator 1P is connected may be connected by the wiring 23, or the shield conductor 63 may be connected to the comb-shaped electrode 11 connected to the GND terminal 3G of the parallel resonator 1P. Further, when the reference potential is given to the reflector 9, the shield conductor 63 may be directly or indirectly connected to the reflector 9 as well.

However, in the example shown, the shield conductor 63 is electrically separated from the filter body 52 on the piezoelectric substrate 5. For example, not only is the shield conductor 63 not short-circuited with the filter body 52 (connected without going through an electronic element), but also it is not connected with the filter body 52 through an electronic element. The "electronic element" is for example a SAN resonator 1, resistor, capacitor, and/or inductor as already explained. Further, for example, the shield conductor 63 is electrically separated from the filter body 52 also in a case where the SAN filter 51 has a cover covering the piezoelectric substrate 5 and a conductor is provided on the cover.

(Frequency Characteristics of Serial Resonator and Parallel Resonator)

Figure 3:
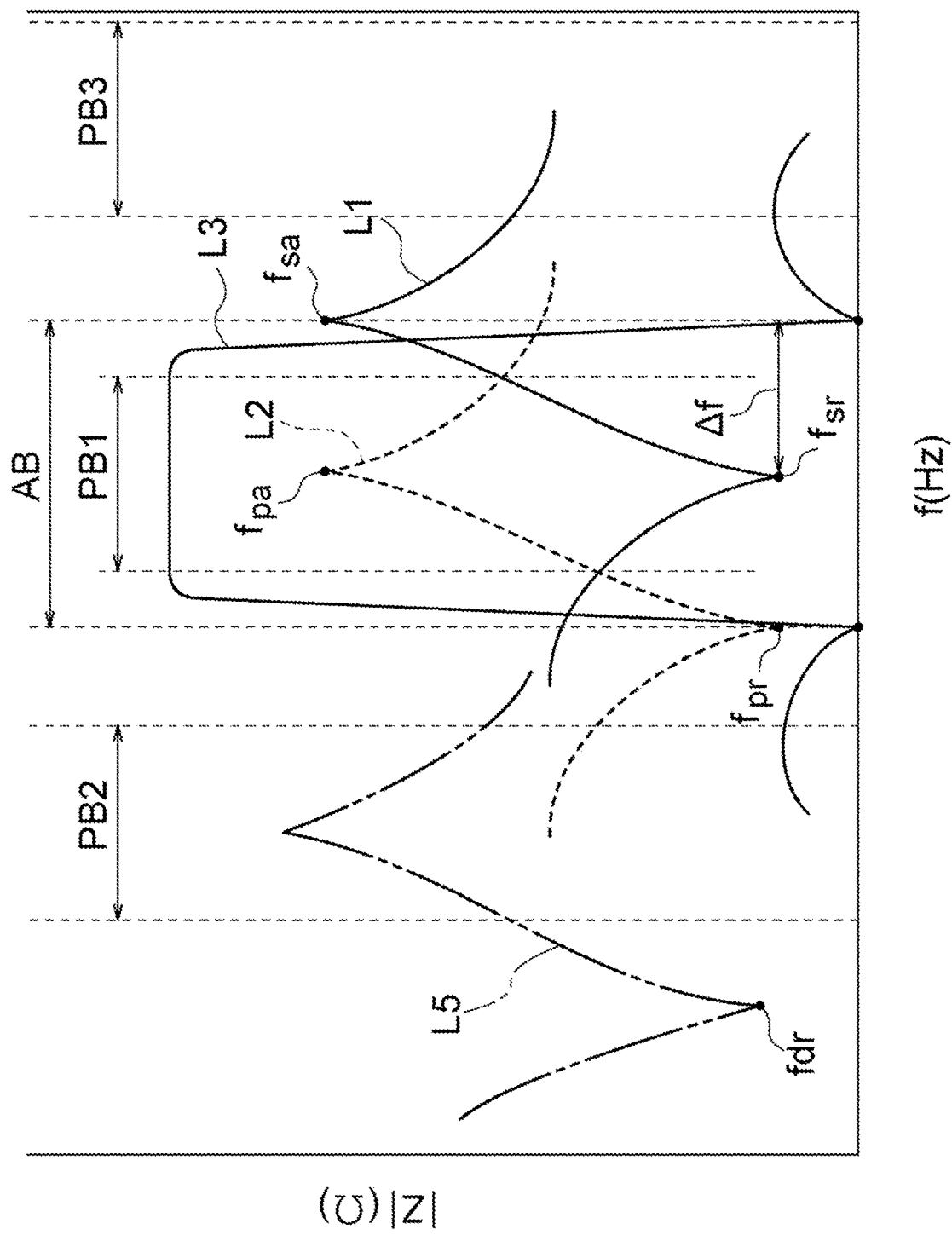
FIG. 3 is a view showing frequency characteristics of the SAN filter in FIG. 2.

FIG. 3 is a graph showing the frequency characteristics of the serial resonator 18 and parallel resonator 1P.

In this graph, an abscissa shows the frequency f (Hz), and an ordinate shows the absolute value |Z| (Q) of impedance or attenuation amount A (d). The line L1 indicates the impedance of the serial resonator 1S. The line L2 indicates the impedance of the parallel resonator 1P. The line L3 indicates the attenuation amount of the SAN filter 51.

In the frequency characteristics of the impedance according to the SAN resonator 1 (serial resonator 1S, parallel resonator 1P), a resonance point at which the impedance becomes the minimum value and an antiresonance point at which the impedance becomes the maximum value appear. The frequencies at which the resonance point and the antiresonance point appear will be defined as resonance frequencies (fsr, fpr) and antiresonance frequencies (fsa, fpa). In the SAW resonator 1, the antiresonance frequency is higher than the resonance frequency.

The serial resonator 1S and the parallel resonator 1P are set in the resonance frequency and antiresonance frequency so that the resonance frequency fsr of the serial resonator 1S (line L1) and the antiresonance frequency fpa of the parallel resonator 1P (line L2) substantially coincide. Due to this, the SAN filter 51 (line L3) functions as the filter having a somewhat narrower range than the frequency range (attenuation area AB) from the resonance frequency fpr of the parallel resonator 1P to the antiresonance frequency fsa of the serial resonator 1S as a passing band PB1.

Accordingly, from another viewpoint, in the SAN filter 51, the plurality of serial resonators 1S are basically made equal to each other in the resonance frequencies. Further, they are basically made equal to each other in the antiresonance frequencies. The same is true for the plurality of parallel resonators 1P.

However, even if it is said that they are equal, a difference due to a common difference or the like may exist. Further, for example, according to the demanded specifications and the like, in general, among the plurality of resonance frequencies (among the antiresonanoe frequencies), a difference less than 0.3% of each resonance frequency (antiresonanoe frequency) is permitted. Further, as a result of adjustment for improvement of the characteristics of the entire SAN filter 51, a relatively large difference may exist as well.

Here, in each serial resonator 1S, the difference between the resonance frequency and the antiresonance frequency will be defined as Δf. At this time, even if the difference of resonance frequencies among the plurality of serial resonators 1S is relatively large, for example, this difference is smaller than Δf/2 even if Δf of any serial resonator 1S is used. The same is true for the antiresonance frequencies of the serial resonators 1S and for the resonance frequencies and antiresonance frequencies of the parallel resonators 1P. For the parallel resonators 1P, use may be made of Δf of the parallel resonator 1P.

Next, a duplexer having a transmission filter configured by a ladder-type acoustic wave filter and a receiving filter configured by a ladder-type acoustic wave filter will be considered. The passing band of the transmission filter and the passing band of the receiving filter naturally do not overlap with each other. For example, the SA filter 51 will be assumed to be the transmission filter. In this case, the passing band of the receiving filter becomes a passing band PB2 on a lower frequency side than the passing band PB1 or PB3 on a higher frequency side than the passing band PB1.

Further, although not particularly shown, the resonance frequency of the serial resonator 1S in the receiving filter is positioned at schematically the center of the passing band PB2 or PB3. Further, the passing bands PB1 to PB3 usually have at least a bandwidth of about Δf. Further, in general, the passing band of the transmission filter and the passing band of the receiving filter schematically have equal bandwidths. Accordingly, the difference between the resonance frequency of the serial resonator 1S in the transmission filter and the resonance frequency of the serial resonator 1S in the receiving filter does not became smaller than Δf/2 of any serial resonator 1S. The same is true for the antiresonance frequency of the serial resonator 1S and the resonance frequency and antiresonance frequency of the parallel resonator 1P.

The U-shaped serial arm 53 in the SAW filter 51, at a glance, for example, looks like the serial arm in the transmission filter and the serial arm in the receiving filter were connected whereby the two form a U-shape in a duplexer. However, in the duplexer, provision is made of a terminal used for both of the input and output at the folded back position of the U-shape, therefore the SAN filter 51 and the duplexer are differentiated according to whether this terminal is present or not present.

Further, as will be understood from the explanation of the frequency characteristics described above, the SAN filter 51 and the duplexer may be differentiated according to whether the difference of the resonance frequencies and/or antiresonance frequencies of the plurality of SAN resonators 1 is smaller than Δf/2. From another viewpoint, for example, in a device having a plurality of SAN resonators 1 connected in series (for example a duplexer), the range of one filter may be specified according to whether the difference of the resonance frequencies thereof is smaller than Δf/2.

As described above, in the present embodiment, the SAW filter 51 has the piezoelectric substrate 5, the filter body 52 on the piezoelectric substrate 5, and the shield conductor 63. The filter body 52 has the serial arm 53 including the mutually serially connected plurality of serial resonators 1S and one or more parallel resonators 1P in a state where they are connected in a ladder shape. The difference of the resonance frequencies among the plurality of serial resonators 1S is smaller than a half of the difference (Δf/2) between the resonance frequency and the antiresonance frequency of each serial resonator 1S. The serial arm 53 has the first divided arm 59A extending from one side (−D2 side) toward the other side (+D2 side) of the predetermined direction (D2 axis direction) on the piezoelectric substrate 5 and the second divided arm 59B which is folded back from the other side (+D2 side) of the first divided arm 59A and extends toward the one side (−D2 side). The shield conductor 63 has a portion which is positioned between at least one of the serial resonators 1S included in the first divided arm 59A and at least one of the serial resonators 1S included in the second divided arm 59B.

Accordingly, for example, the mutual electromagnetic coupling of the serial resonators 1S can be reduced by the shield conductor 63. As a result, for example, the attenuation characteristic outside of the passing band can be improved. Conventionally, in one ladder-type filter (not a duplexer), the serial arm was extended without being folded back. That is, it did not have a configuration in which any member could be interposed between the parts of the serial arm (the parts including at least one serial resonator 1S). However, in the SAN filter 51, by making the serial arm 53 fold back, arrangement of the shield conductor 63 between the single portions of the serial arms is enabled. This is epoch-making. Further, in simulation computations by the inventors of the present application, compared with the case where the serial arm extended without being folded back, the SAN filter 51 was improved in the attenuation characteristic.

Further, in the present embodiment, the filter body 52 further has the capacitor element 57 which is connected to the serial resonator 1S or parallel resonator 1P and is positioned between the first divided arm 59A (or second divided arm 59B) and the shield conductor 63.

Accordingly, for example, the distance between the two divided arms 59 can be made larger, and the attenuation characteristic can be further improved. Such a capacitor element 57 is for example provided in order to improve the characteristics of the SAW filter 51 by increasing the capacity of the SAW resonator 1. Accordingly, this results in the attenuation characteristic being able to be improved by adjustment of the layout of the capacitor element 57 and the SAN resonator 1 without enlarging the area of the entire filter body 52.

Further, in the present embodiment, the shield conductor 63 is electrically separated from the filter body 52.

Accordingly, for example, compared with the case where the shield conductor 63 is directly or indirectly connected with the parallel resonator 1P, the probability of an unwanted component escaping from the parallel resonator 1P causing fluctuation in the potential of the shield conductor 63 is reduced. As a result, the effect of suppressing the electromagnetic coupling of the shield conductor 63 is improved.

(First to Fourth Modifications)

FIG. 4A, FIG. 4B, FIG. 5A, and FIG. 5B are plan views showing SAW resonators according to modifications used in SAW filters 51. These views correspond to the half on the +D1 side in FIG. 1. Note that, the half on the −D1 side is for example line symmetrical about a symmetrical axis parallel to the D2 axis or rotation symmetrical by 180° about a symmetrical axis parallel to the D3 axis relative to the shown half.

In these modifications, the settings of the sizes of the gaps Gp (Gpe and Gpc) between the tip ends of the electrode fingers 15 in one comb-shaped electrode 11 and the other comb-shaped electrode 11 in the D2 axis direction are different from those in the embodiment. Specifically, this is as follows. Note that, in the following explanation, the size of the gap GP designates the size in the D2 axis direction unless otherwise indicated.

(First Modification)

Figure 4A:
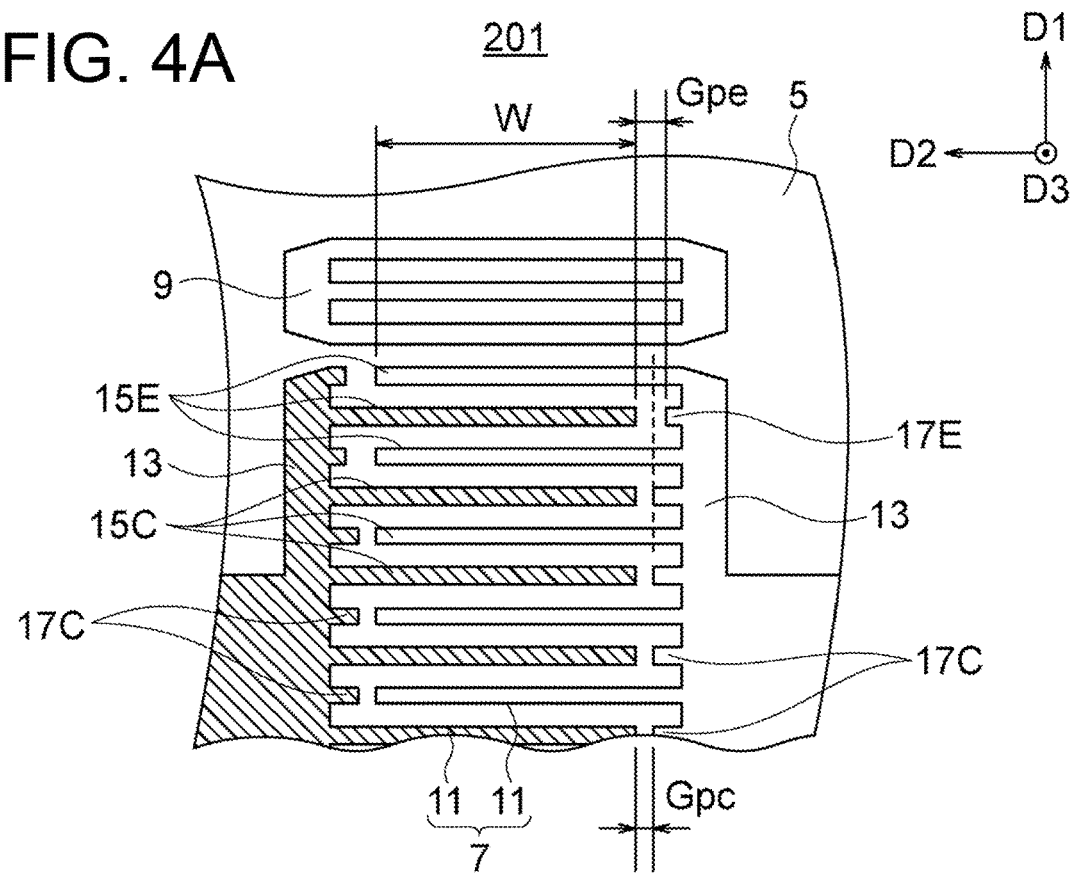
FIG. 4A and FIG. 4B are plan views showing the configurations of SAN resonators according to first and second modifications.
Figure 4B:
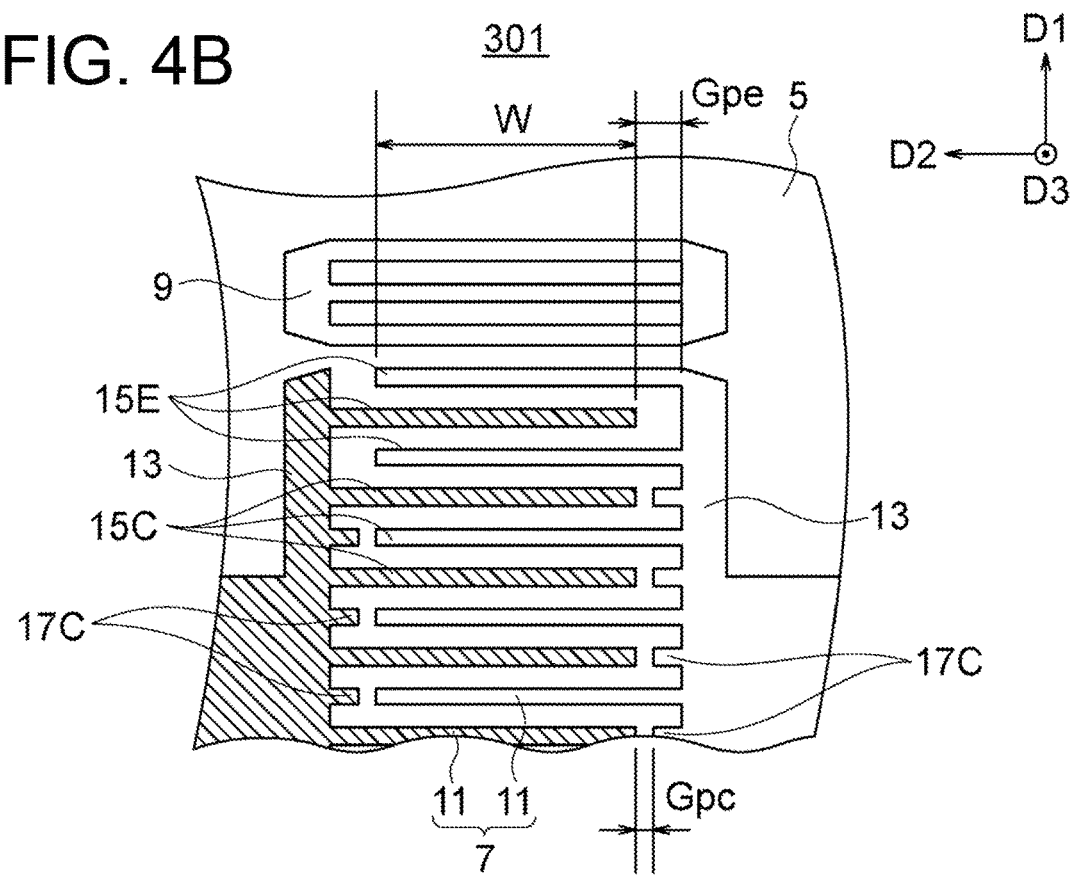

In a SAN resonator 201 according to a first modification shown in FIG. 4A, the pluralities of electrode fingers 15 include a predetermined number of and part side electrode fingers 15E which are positioned on the end part side (reflector 9 side) in the IDT electrode 7 and a larger number of center side electrode fingers 15C than the predetermined number which are positioned on the center side of the IDT electrode 7 relative to the end part side electrode fingers 15E. Further, the pluralities of dummy electrodes 17 include and part side dummy electrodes 17E facing the tip ends of the end part side electrode fingers 15E across a gap Gpe in the D2 axis direction and center side dummy electrodes 17C facing the tip ends of the center side electrode fingers 15C across a gap Gpc in the D2 axis direction. Further, the gap Gpe is larger than the gap Gpc.

Here, short-circuiting in the D2 axis direction between the tip ends of the electrode fingers 15 in one comb-shaped electrode 11 and the other comb-shaped electrode 11 (in more detail, here, the dummy electrodes 17) easily occurs in the end parts on the reflector 9 sides in the IDT electrode 7. The reasons for this are that, for example, in an etching process of the IDT electrode 7 and reflectors 9, a difference of potential arises between the two and that a wiring 23 which would exert an influence upon exposure if positioned at the periphery of the IDT electrode 7 is not positioned at the periphery of the reflector 9.

Accordingly, for example, by making the gap Gpe relatively larger as described above to reduce the probability of short-circuiting, in the IDT electrode 7 as a whole, the probability of short-circuiting in the gap Gp can be reduced.

From another viewpoint, all gaps Gp are not made large, but some of the gaps Gpe on the end part side are made larger, so a drop in the characteristics of the IDT electrode 7 can be suppressed while the probability of short-circuiting can be efficiently reduced.

The number of the and part side electrode fingers 15E is for example one to four on one end side of the IDT electrode 7 (three in the example shown and, further, two to eight on the two ends of the IDT electrode 7). Further, from another viewpoint, the number of the end part side electrode fingers 15E, for example, on one end side of the IDT electrode 7, is 10% or less, 5% or less, or 3% or less of the number of all electrode fingers 15 in the IDT electrode 7 (20% or less, 10% or less, or 6% or less on the two ends of the IDT electrode 7).

Note that, where provision is made of the already explained narrow pitch parts on the two sides of the IDT electrode 7, at least some of the and part side electrode fingers 15E may be ones configuring the narrow pitch parts as well. Further, the center side electrode fingers 15C for example may be all electrode fingers 15 in the IDT electrode 7 excluding the end part side electrode fingers 15E.

As described above, by making the number of the and part side electrode fingers 15E relatively small, a drop in the characteristics of the IDT electrode 7 due to the increase in size of the gap Gpe can be suppressed.

The size of the gap Gpe (D2 axis direction) may be suitably set. For example, the size of the gap Gpe may be 1.1 times or more and 10 times or less or 5 times or less of the size of the gap Gpc. Note that, the size of the gap Gpc is for example λ/8 to λ/2, where the wavelength of the SAN propagating through the IDT electrode 7 is "λ".

When there are a plurality of gaps Gpe, the sizes of the plurality of gaps Gpe may be the same as each other (example shown) or may be different from each other. In the latter case, for example, a gap Gpe closer to the end part side may be made larger as well. For a plurality of gaps Gpc as well, in the same way, the sizes of all gaps Gpc need not be the same. Further, in the arrangement of the plurality of center side electrode fingers 15C, electrode fingers 15 having tip ends facing dummy electrodes 17 (other comb-shaped electrode 11) in the D2 axis direction across gaps Gp larger than the gaps Gpe may be mixed in as well.

The size in the D1 axis direction of the gap Gpe may be equal to the size in the D1 axis direction of the gap Gpc. That is, the width of the end part side electrode fingers 15E (and end part side dummy electrodes 17E) may be equal to the width of the center side electrode fingers 15C (and center side dummy electrodes 17C). However, in the end parts of the IDT electrode 7, the width of the electrode fingers 15 including at least parts of the end part side electrode fingers 15E may be made smaller or larger than the widths of the electrode fingers 15 at the center sides from the same.

In the SAN resonator 201, as indicated by a dotted line on the right side on the drawing sheet, the end part side dummy electrode 17E is made shorter than the center side dummy electrodes 17C, whereby the gap Gpe is made larger than the gap Gpc. From another viewpoint, the length of the end part side electrode finger 15E is equal to the lengths of the center side electrode fingers 15C.

In this way, when making the end part side dummy electrode 17E relatively shorter to thereby make the gap Gpe relatively larger, for example, the intersecting width W of the electrode fingers 15 (length of overlap in the D2 axis direction by mutually adjacent electrode fingers 15) basically does not change between the case where the gap Gpe is not made larger and the case where it is made larger. As a result, for example, the probability of short-circuiting failure is reduced, while the effect of maintaining the characteristics of the SAN resonator 201 is improved.

The example shown is an aspect where the mutually facing edge parts of the bus bars 13 in the pair of comb-shaped electrodes 11 are parallel with each other and where the lengths of the center side electrode fingers 15C and the end part side electrode fingers 15E are equal to each other (from another viewpoint, an aspect where the intersecting width N is constant over the center side electrode fingers 15C and the end part side electrode fingers 15E). However, the method of design described above making the end part side dummy electrodes 17E relatively short (from another viewpoint, shorter than the original design value) and making the gap Gpe larger than the gap Gpc can be applied to also an apodized IDT electrode 7 in which the intersecting width N changes.

Note that, for example, in an apodized IDT electrode 7, sometimes a line connecting the tip ends of the plurality of electrode fingers 15 in one comb-shaped electrode 11 is linear over predetermined numbers (for example 10) or more of electrode fingers 15 from the end parts on the reflector 9 sides in the one comb-shaped electrode 11. In this case, for example, if the portions facing the above linear portions in the line connecting the tip ends of the dummy electrodes 17 in the other comb-shaped electrode 11 are basically parallel with the above linear portions while breaking the linearity by being positioned at the bus bar 13 side of the other comb-shaped electrode 11 at parts of the reflector 9 sides (for example one or two of the dummy electrodes 17 in the other comb-shaped electrode 11), it may be said that the end part side dummy electrode 17E is made shorter.

Further, for example, in an apodized IDT electrode 7, sometimes a line connecting the tip ends of the plurality of electrode fingers 15 in one comb-shaped electrode 11 has regularity such as a sine wave or triangular wave. In this case, for example, if the line connecting the tip ends of the dummy electrodes 17 in the other comb-shaped electrode 11 basically has the regularity described above so that the size of the gap Gp becomes constant while breaking the above regularity by being positioned on the side closer to the bus bar 13 in the other comb-shaped electrode 11 at parts of the reflector 9 sides (for example one or two of the dummy electrodes 17 in the other comb-shaped electrode 11), it may be said that the end part side dummy electrode 17E is made shorter.

The SAW resonator 201 may be replaced with all SA resonators 1 (1 and 1P) in the SAW filter 51 or may be replaced with some of the SAW resonators 1. Further, when replaced with part of the SAW resonators 1, that part may be the serial resonators 1S and/or parallel resonators 1P at any position.

For example, sometime the duty ratios (w/p) are different from each other between at least parts of the plurality of SA resonators in the SAN filter 51. In this case, one or more SAN resonators 201 of each part among the plurality of SAW resonators in the SAN filter 51 may be resonators with duty ratios larger than another part or all of the resonators in the SAW filter 51. In this case, when two or more SAN resonators 201 are provided, the duty ratios of the two may be the same or may be different.

Further, for example, where the duty ratios are different from each other between at least parts of the plurality of SAN resonators in the SAN filter 51, only the resonator having the largest duty ratio may be the SAN resonator 201. Note that, the number of the resonators having the largest duty ratio may be one or may be two or more so long as not all of the plurality of SAN resonators. For example, there may be just one.

Here, a SAN resonator having a relatively large duty ratio is larger in area of the electrode fingers 15 relative to the area of the clearances around the electrode fingers 15, therefore short-circuiting is apt to occur. Accordingly, as described above, the SAN resonator 201 according to the modification is not used for all SAN resonators. The SAW resonator 201 according to the modification is used for only part of the SAW resonators having a relatively large duty ratio. Due to this, the characteristics of the SAN resonator is maintained while the probability of short-circuiting can be reduced.

Other than the matters explained above, the SAW resonator 201 may be made the same as in the SAN resonator 1. However, for example, in order to compensate for the change in characteristics which occurs due to the increase in size of the gap Gpe, various parameters such as number and length of the electrode fingers 15 may be finely adjusted. There may be a difference due to this between the SAN resonator 1 and the SAN resonator 201.

Note that, the gap Op between the electrode fingers 15 and the dummy electrodes 17 is one example of the gap in the D2 axis direction between the tip ends of the electrode fingers 15 in one comb-shaped electrode 11 and the other comb-shaped electrode 11.

(Second Modification) In the SAN resonator 201 in the first modification, the lengths of the end part side dummy electrodes 17E which faced the tip ends of the end part side electrode fingers 15E were made relatively shorter so as to make the gap Gpe larger than the gap Gpc. Contrary to this, in a SAN resonator 301 of a second modification shown in FIG. 4B, dummy electrodes 17 facing the tip ends of the end part side electrode fingers 15E are not provided. Due to this, the gap Gpe is made larger than the gap Gpc. The matters other than that may be made the same as those in the first modification.

In this second modification as well, in the same way as the first modification, the intersecting width N of the electrode fingers 15 basically does not change between the case where the gap Gpe is not made larger and the case where it is made larger. As a result, for example, the effect of reducing the probability of short-circuiting failure while maintaining the characteristics of the SAN resonator 301 is improved.

Note that, as will be understood from the fact that the tip ends of the end part side electrode fingers 15E and the bus bar 13 face each other across the gap Gpe, the gap Gp in the D2 axis direction between the tip ends of the electrode fingers 15 in one comb-shaped electrode 11 and the other comb-shaped electrode 11 is not limited to the gap Gp between the tip ends of the electrode fingers 15 and the tip ends of the dummy electrodes 17.

(Third Modification)

In the SAW resonator 201 in the first modification, the lengths of the end part side dummy electrodes 17E which faced the tip ends of the end part side electrode fingers 15E were made relatively shorter so as to make the gap Gpe larger than the gap Gpc. Contrary to this, in a SAW resonator 401 of a third modification shown in FIG. 5A, the lengths of the end part side electrode fingers 15E are made shorter than the lengths of the center side electrode fingers 15C. Due to this, the gap Gpe is made larger than the gap Gpc. From another viewpoint, the lengths of the end part side dummy electrodes 17E and the lengths of the center side dummy electrodes 17C are equal. The matters other than that may be made the same as those in the first modification.

In the third modification as well, in the same way as the first and second modifications, the gap Gpe positioned at the end parts of the IDT electrode 7 is made relatively larger, thereby the characteristics of the IDT electrode 7 is kept from dropping while the probability of short-circuiting is reduced.

(Fourth Modification)

Figure 5A:
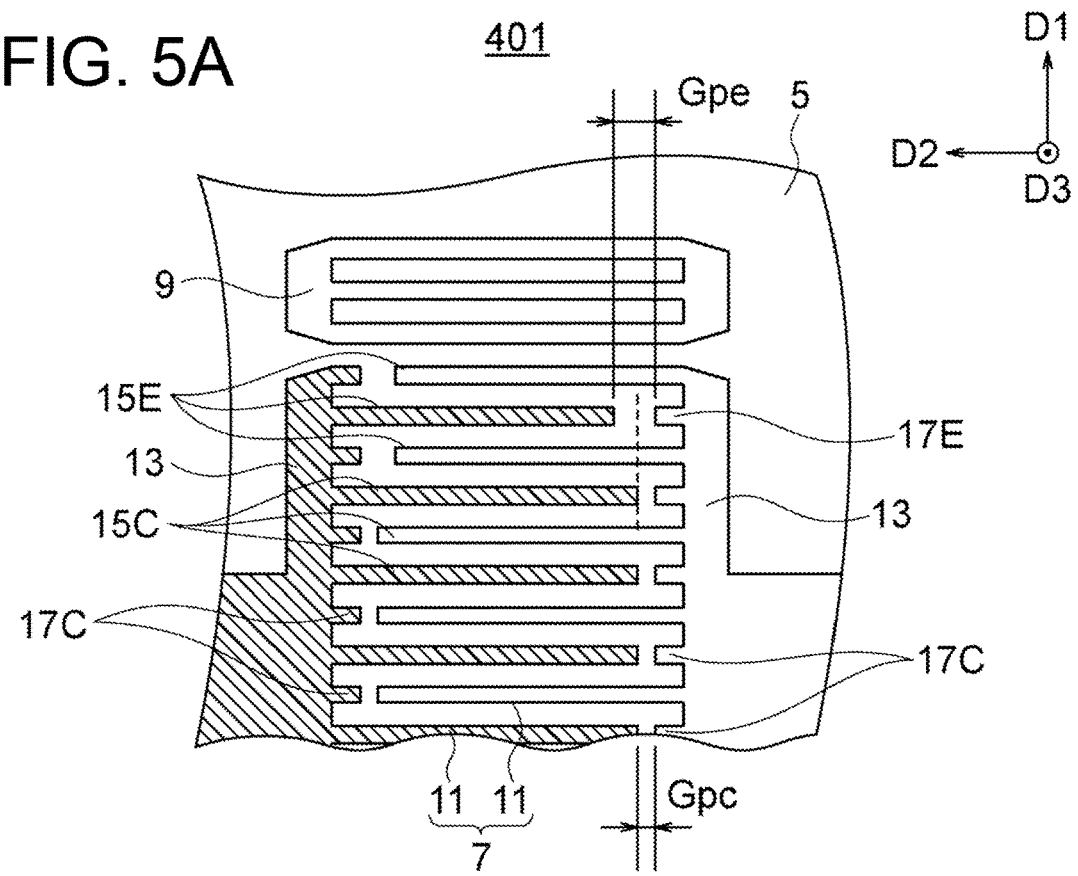
FIG. 5A and FIG. 5B are plan views showing the configurations of SAN resonators according to third and fourth modifications.
Figure 5B:
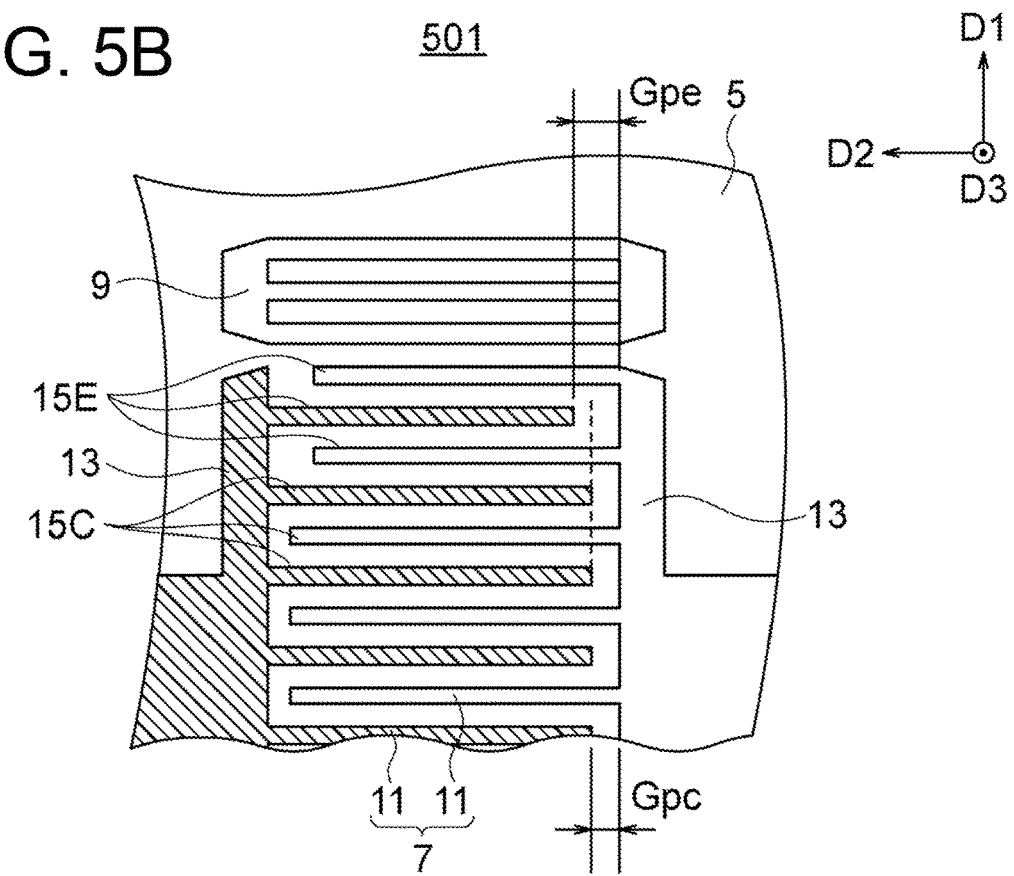

In a fourth modification shown in FIG. 5B, in the same way as the third modification, the lengths of the end part side electrode fingers 15E are made shorter than the lengths of the center side electrode fingers 15C so as to make the gap Gpe larger than the gap Gpc. However, in the fourth modification, unlike the third modification, a plurality of dummy electrodes 17 are not provided. The matters other than that may be the same as those in the first to third embodiments.

In the fourth modification as well, in the same way as the first to third modifications, the gap Gpe positioned at the end parts of the IDT electrode 7 is made relatively larger, thereby the characteristics of the IDT electrode 7 is kept from dropping while the probability of short-circuiting is reduced.

Note that, the first modification and the second modification may be combined. The first modification and/or second modification and the third modification may be combined. Further, the first to fourth modifications may be applied to not only an IDT electrode 7 included in a serial resonator 1S or parallel resonator 1P, but also another IDT electrode 7. For example, these may be applied to the additional IDT electrode in a fifth modification which will be explained later as well.

The first to fourth modifications explained above may be applied to a resonator to which a strong electrical power is applied among the ladder-type filters. That is, they may be applied to a resonator formed as a divided resonator (first serial resonator 181 in the example shown in FIG. 2), a resonator to which a strong power is applied, but space saving is required, and other resonators.

(Fifth Modification)

Figure 6:
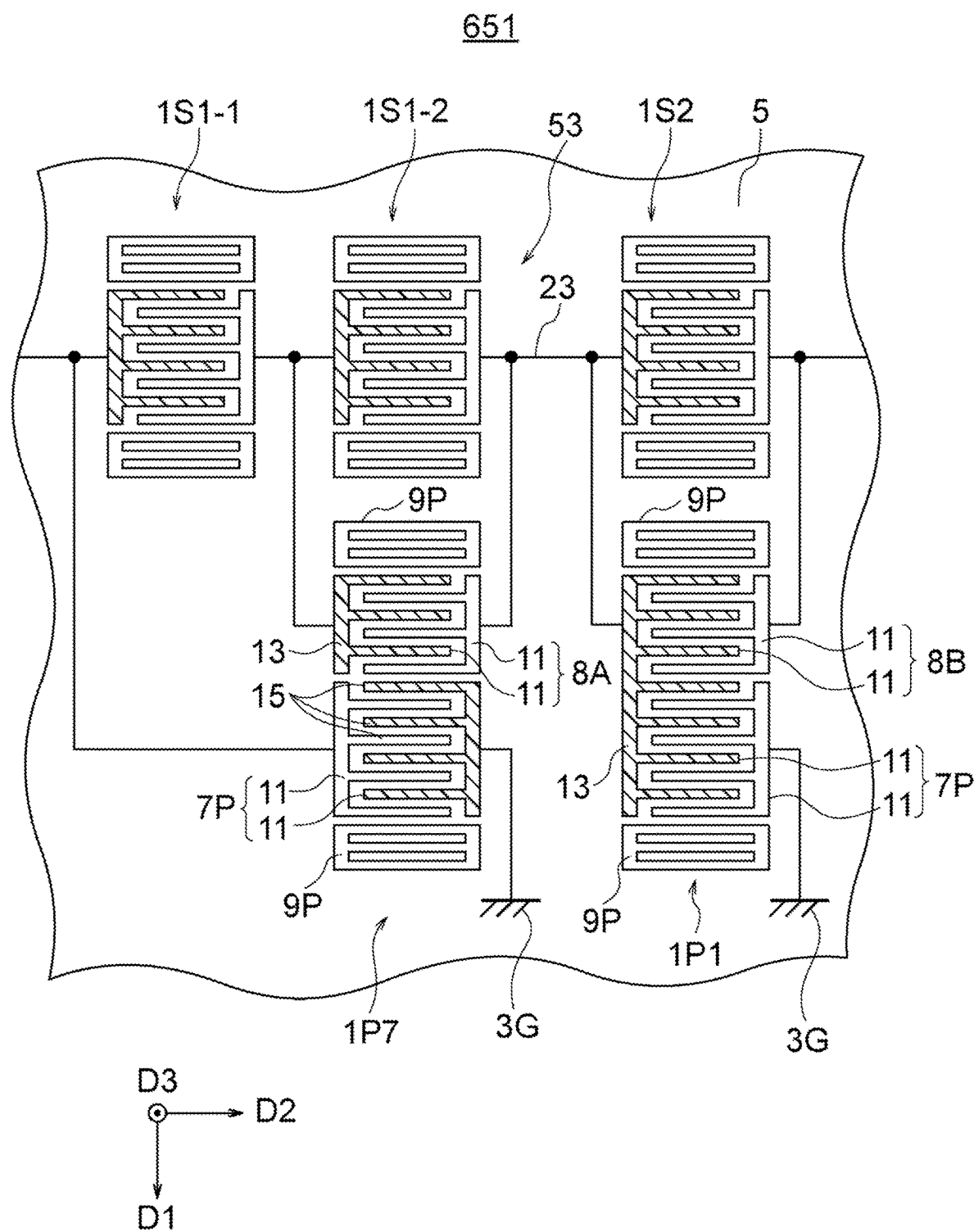
FIG. 6 is a plan view showing a portion of a SAW filter according to a fifth modification.

FIG. 6 is a plan view showing a portion of a SAN filter 651 according to a fifth modification.

This view may be grasped as a view extracting portions of the first serial resonator 181, first parallel resonator 1P1, and second serial resonator 182 in the SAW filter 51 in FIG. 2. However, relative positions etc. on the piezoelectric substrate 5 of the plurality of SAW resonators 1 are simplified.

In the explanation of the present modification, for convenience, sometimes the IDT electrode 7 in the parallel resonator 1P will be referred to as a "parallel IDT electrode 7P", and the reflectors 9 in the parallel resonator 1P will be referred to as "parallel reflectors 9P".

In the example shown in FIG. 6, provision is made of a seventh parallel resonator 1P7 which was not provided in FIG. 2 and is connected to the input side of the first serial resonator 1S1. However, the parallel resonator 1P may be connected to the input side of the first serial resonator 1S1 as well, as explained also in the explanation of the embodiment, therefore provision of the seventh parallel resonator 1P7 itself is not a difference of the present modification relative to the embodiment. The seventh parallel resonator 1P7, more specifically, is connected to the side closer to the input than the first divided resonator 1S1-1 in the front stage (input side) between the two divided resonators.

The SAN filter 651 differs from the embodiment in the point that a first additional IDT electrode 8A and second additional IDT electrode 8B (below, sometimes the two will not be differentiated and will be simply referred to as the "additional IDT electrodes 8") which are connected in parallel to the serial resonator 18 are provided. The additional IDT electrodes 8 are assigned different notations from the IDT electrode 7 for convenience. However, they are the same as the IDT electrode 7 shown in FIG. 1.

In the first serial resonator 11, the first additional IDT electrode 8A is connected in parallel to the second divided resonator 181-2 between the two divided resonators. Further, the first additional IDT electrode SA is positioned between the pair of parallel reflectors 9P in the seventh parallel resonator 1P7 and is adjacent to the parallel IDT electrode 7P in the seventh parallel resonator 1P7 in the direction of propagation of the SAN (D1 axis direction). By the first additional IDT electrode SA and the parallel IDT electrode 7P being adjacent to each other in the direction of propagation of the SAN, so-called vertical coupling becomes possible.

The resonance frequency of the first additional IDT electrode 8A is for example made equal to that of the parallel IDT electrode 7P. Note that, even if they are equal, there may be a difference due to tolerances as well. Further, there may be a difference of less than 0.3% as already explained. Otherwise, for example, as indicated by the line L5 in FIG. 3, the resonance frequency fdr of the first additional IDT electrode 8A is lower than the passing band PB1 realized according to the filter body 52 (serial arm 53 and one or more parallel resonators 1P) by a difference not less than the width of the passing band PB1. Otherwise, for example, in a case where the SAW filter 51 is a transmission filter having a higher passing band PB1 than the passing band PB2 of the receiving filter, the resonance frequency fdr of the first additional IDT electrode 8A is lower than the passing band PB1. Note that, the antiresonance frequency of the first additional IDT electrode 8A is for example equal to the antiresonance frequency of the parallel resonator 1P. However, the two may be different as well.

If such a first additional IDT electrode 8A is provided, for example, in the electrical signal flowing through the serial arm 53, an unwanted component on a lower frequency side relative to the passing band PB1 flows to the first additional IDT electrode 8A. This unwanted component flows to the parallel IDT electrode 7P due to the vertical coupling of the first additional IDT electrode 8A and the parallel IDT electrode 7P and further flows to the GND terminal 3G. Due to this, the attenuation characteristic on a low frequency side of the SAN filter 651 is improved. When the SAN filter 651 is a transmission filter having a higher passing band PB1 than the passing band PB2 of the receiving filter, the attenuation characteristic near the passing band PB2 is improved. As a result, for example, the characteristics of the duplexer are improved.

From another viewpoint, a route through which unwanted components escape is formed not only on the input side of the first divided resonator 11-1, but also on the input side of the second divided resonator 181-2. On the other hand, the pair of parallel reflectors 9P are shared by the parallel IDT electrode 7P and the first additional IDT electrode 8A, therefore the size is reduced.

Further, for example, the first additional IDT electrode 8A is connected in parallel to the serial resonator 18 unlike the parallel IDT electrode 7P. Therefore, for example, it has the same action as the capacitor element 57 which was connected in parallel to the serial resonator 18. Specifically, for example, it contributes to reduction of the Δf of the serial resonator 18 and in turn contributes to making the attenuation characteristic on a high frequency side of the passing band steeper.

The second additional IDT electrode 8B, unlike the first additional IDT electrode 8A, is connected in parallel to the not divided second serial resonator 182. Further, the second additional IDT electrode 8B, in the same way as the first additional IDT electrode 8A, is assembled in the parallel resonator 1P. However, unlike the first additional IDT electrode 8A, the second additional IDT electrode 8B and the second parallel resonator 1P2 in which this second additional IDT electrode 8B is assembled are connected at the same position (input side of the second parallel resonator 1P2) relative to the serial arm 53. The matters other than that in the second additional IDT electrode 8B are the same as those in the first additional IDT electrode 8A. Note that, in the ample shown, in the second additional IDT electrode 8B and the parallel IDT electrode 7P in the second parallel resonator 1P2, the bus bars 13 are connected as if they were one bus bar. However, such connection is not necessary either.

The second additional IDT electrode 8B exerts a similar effect to that by the first additional IDT electrode 8A as well. However, only the first additional IDT electrode 8A exerts the effect of configuring a new route for allowing unwanted components to escape to the GND terminal 3G separately from the parallel resonator 1P.

The additional IDT electrodes 8 may be provided with respect to all of the plurality of serial resonators 1S in the SAN filter 51, may be provided with respect to a part. In the latter case, the additional IDT electrodes 8 may be provided with respect to any serial resonator 1. Further, when the serial resonator 1S is divided, in place of or in addition to the additional IDT electrode 8 (8A) which is connected in parallel to the divided resonator in the latter stage (1S1-2 in the example shown), an additional IDT electrode 8 which is connected in parallel to the divided resonator in the front stage (11-1 in the example shown) may be provided as well.

In the example shown, the parallel resonator 1P in which the additional IDT electrode 8 is assembled was made the parallel resonator 1P which was connected to the input side of the serial resonator 1S in which the additional IDT electrode 8 was connected in parallel. However, the parallel resonator 1P in which the additional IDT electrode 8 is assembled may be one connected to the output side of the serial resonator 1 in which the additional IDT electrode 8 is connected in parallel or may be one connected to the input side or output side of the other serial resonator 1S in the SAW resonator 651.

In the example shown, between the pair of reflectors 9, one parallel IDT electrode 7P and one additional IDT electrode 8 were arranged. However, although not particularly shown, for example, two parallel IDT electrodes 7P which are connected in parallel to each other may be arranged in the D1 axis direction between the pair of parallel reflectors 9P (from another viewpoint, one parallel IDT electrode 7P is divided into two in the D1 axis direction) and one additional IDT electrode 8 may be arranged between those. Further, for example, the two additional IDT electrodes 8 which are connected in parallel to each other may be arranged in the D1 axis direction between the pair of parallel reflectors 9P (from another viewpoint, the additional IDT electrode 8 is divided into two in the D1 axis direction) and one parallel IDT electrode 7P may be arranged between them. In any case, it can be said that the pair of parallel reflectors 9P are positioned on the two sides of the predetermined arrangement direction (D1 axis direction) with respect to the parallel IDT electrode 7P, and the parallel IDT electrode 7P is adjacent to the additional IDT electrode 8 in the direction of arrangement described before between the pair of parallel reflectors 9P. Further, although not particularly shown, a SAW resonator to be connected in series to the additional IDT electrode 8 may be provided as well between the serial arm 53 and the additional IDT electrode 8.

Figure 7:
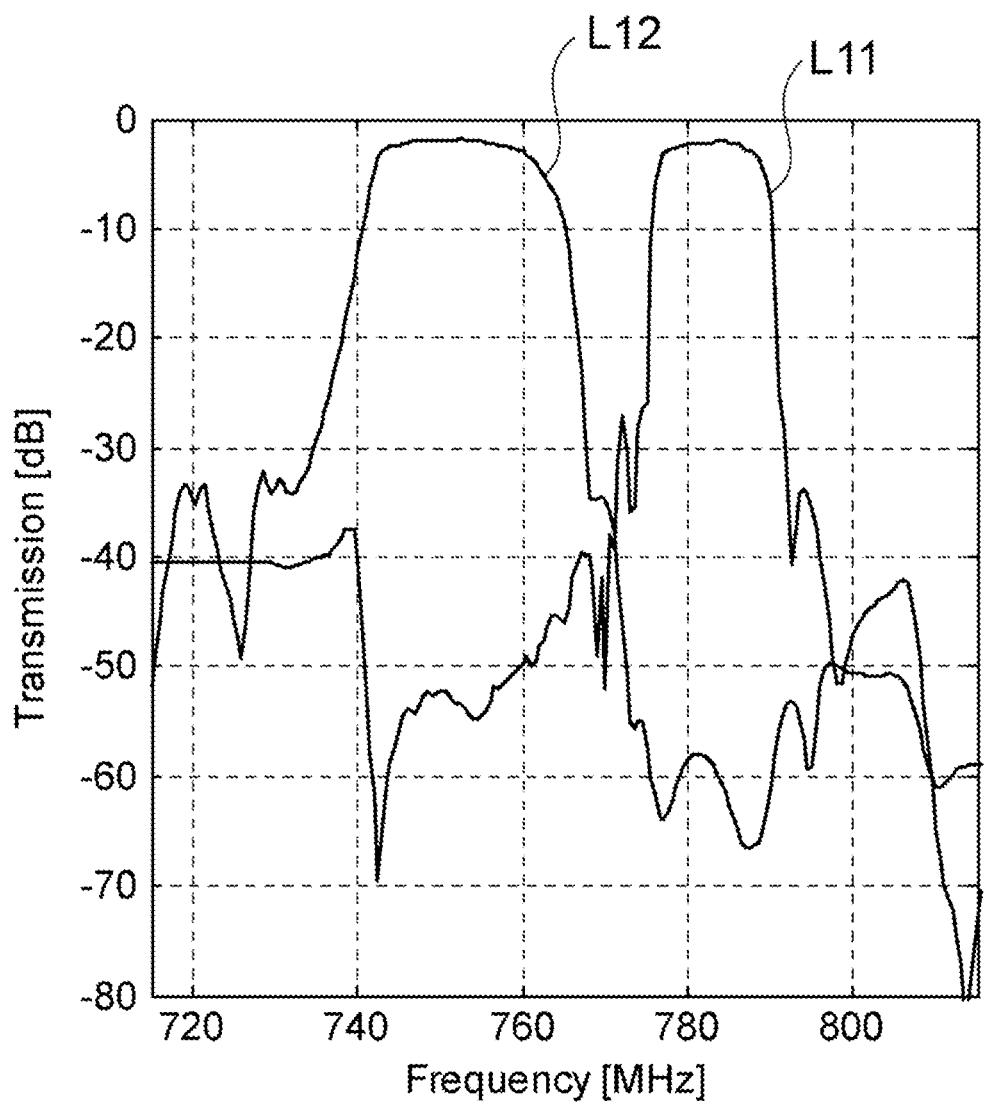
FIG. 7 is a view showing results of simulation of the characteristics of the SAW filter in FIG. 6.

FIG. 7 shows the results of simulation computations carried out for the characteristics of the SAW filter 651. In this graph, the abscissa shows the frequency, and the ordinate shows the pass characteristic.

In the simulation computations, a duplexer having a transmission filter and a receiving filter is assumed. A case where the configuration of the fifth modification is applied to the transmission filter is assumed. Further, unlike the embodiment, a configuration in which the serial arm is not folded back is assumed. Also, the numbers of the serial resonators 1S and parallel resonators 1P assumed are different from those in the example shown. Further, an aspect where both of the first additional IDT electrode 8A and second additional IDT electrode 8B are arranged is assumed.

In the same graph, the line L11 indicates the pass characteristic of the transmission filter. The line L12 indicates the pass characteristic of the receiving filter. As read from the same graph, by providing the additional IDT electrodes 8, in the passing band of the receiving filter, the attenuation characteristic of the transmission filter is improved.

(Example of Utilization of Acoustic Wave Device: Multiplexer)

Figure 8:
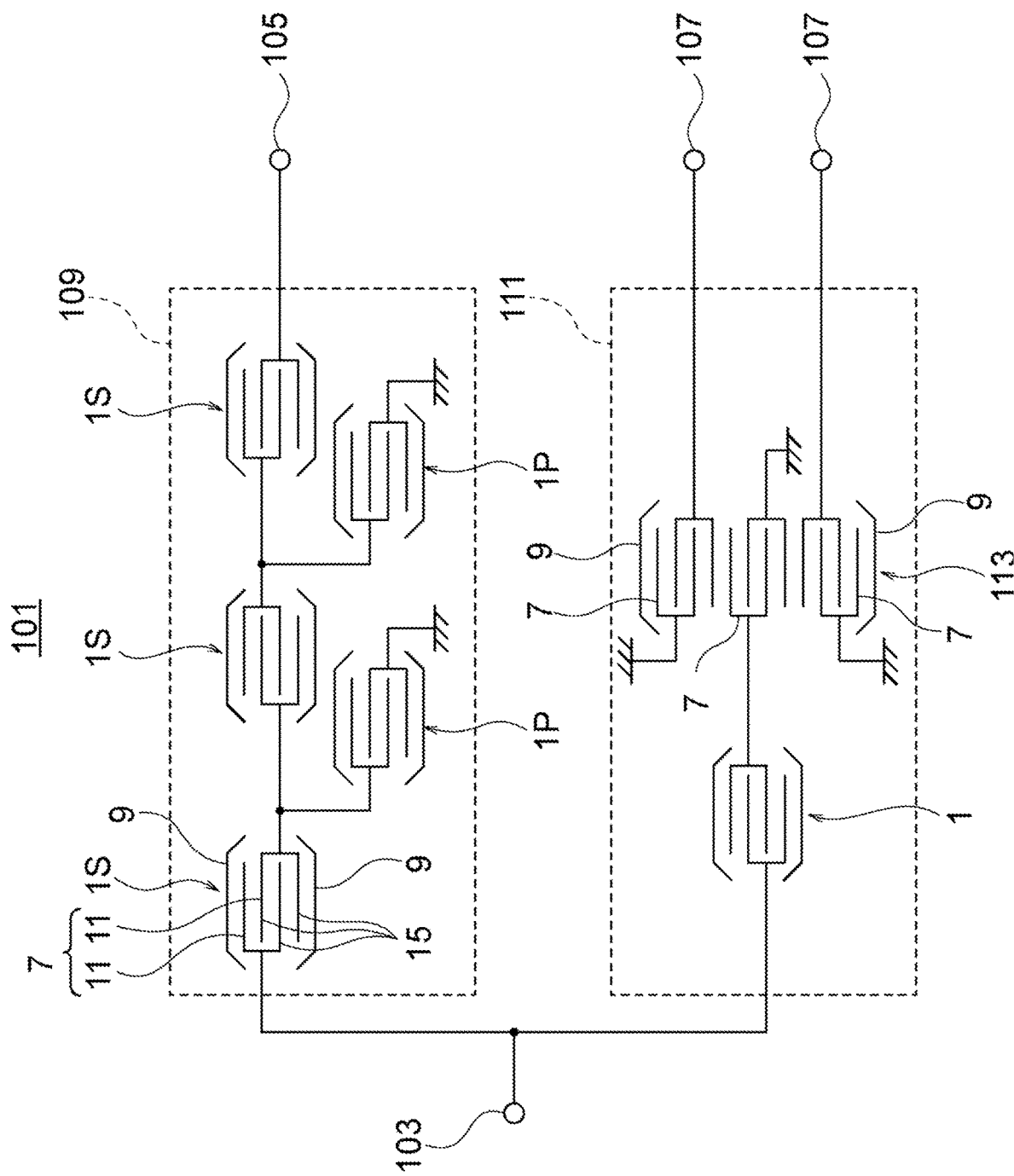
FIG. 8 is a view schematically showing a multiplexer as an example of utilization of the SAN filter in FIG. 2.

FIG. 8 is a circuit diagram schematically showing the configuration of a multiplexer 101 (for example duplexer) as an example of utilization of the SAN filter 51. As will be understood from the notations shown on the top left on the drawing sheet in this view, the comb-shaped electrodes 11 are schematically shown by a two-prong fork shape in this view. The reflector 9 is represented by one line bent at the two ends. Further, in this view, the numbers of the serial resonators 1S and parallel resonators 1P are decreased more than those in FIG. 2, and the specific arrangement on the piezoelectric substrate 5 of the SAN resonator 1 (for example U-shape of the serial arm) is omitted.

The multiplexer 101 for example has a transmission filter 109 which filters a transmission signal from a transmission terminal 105 and outputs the result to an antenna terminal 103 and has a receiving filter 111 which filters the reception signal from the antenna terminal 103 and outputs the result to a pair of reception terminals 107.

The transmission filter 109 is for example configured by the SAW filter 51 (or 651) in the embodiment. The transmission terminal 105 is the input terminal 3I or a terminal connected to this input terminal 3I. The antenna terminal 103 is the output terminal 3O or a terminal connected to this output terminal 3O.

The receiving filter 111 is configured including for example the SA resonator 1 and a multi-mode type filter (including double mode type filter) 113. The multi-mode type filter 113 has a plurality of (three in the example shown) IDT electrodes 7 which are arranged in the direction of propagation of the acoustic wave and a pair of reflectors 9 which are arranged on the two sides of the same. Note that, the SAW resonator 1 and the multi-mode type filter 113 configuring the receiving filter 111 are for example provided on the same piezoelectric substrate 5.

Note that, the transmission filter 109 and the receiving filter 111 may be provided on the same piezoelectric substrate 5 or may be provided on mutually different piezoelectric substrates 5. FIG. 8 is, in the end, one example of the configuration of the multiplexer 101. For example, the receiving filter 111 may be configured by a ladder-type filter in the same way as the transmission filter 109 as well. The multiplexer 101 is not limited to a duplexer. For example, it may be a diplexer or a multiplexer including three or more filters.

(Example of Utilization of Acoustic Wave Device: Communication Apparatus)

Figure 9:
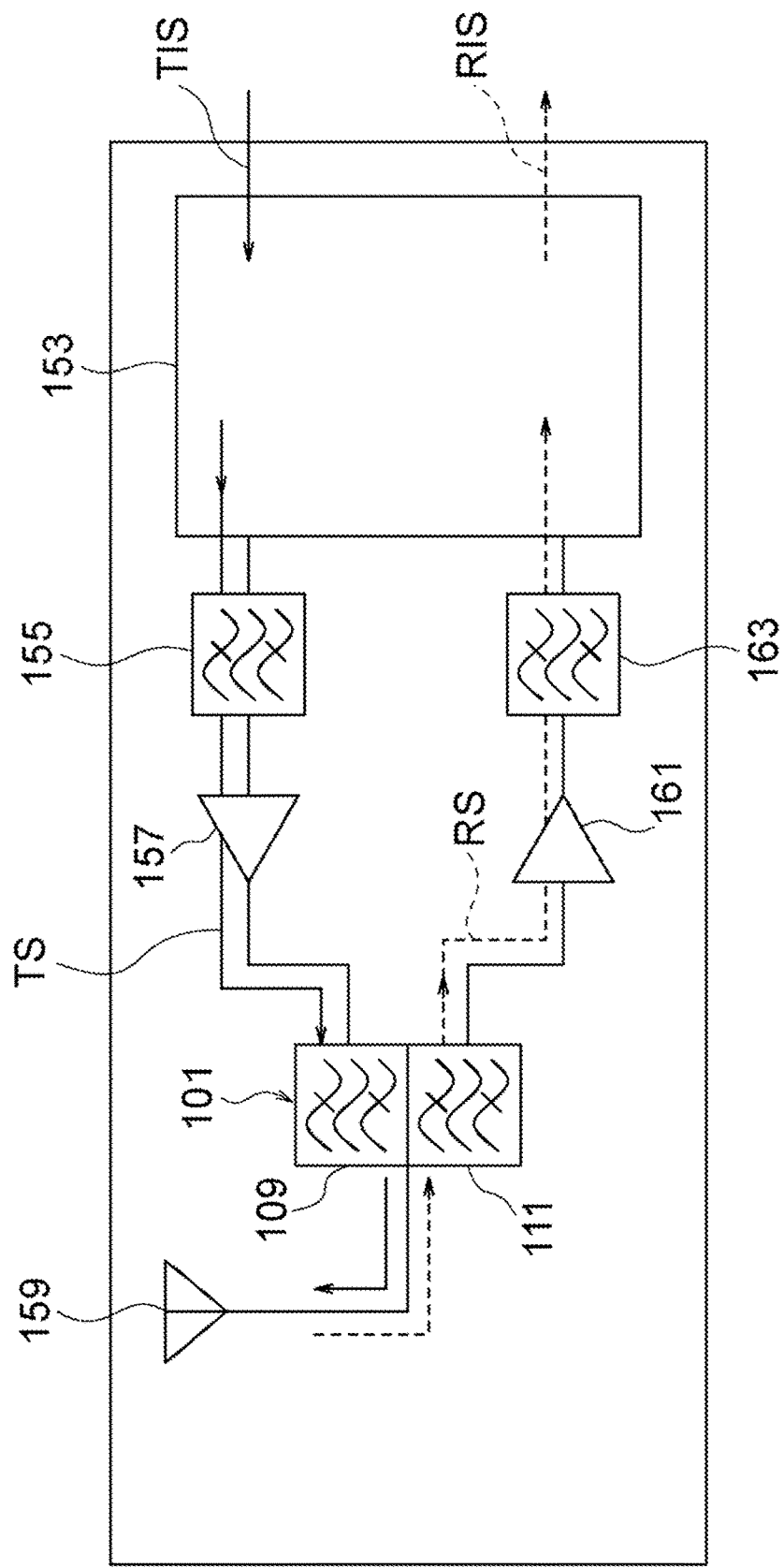
FIG. 9 is a block diagram showing the configuration of a principal part of a communication apparatus as an example of utilization of the multiplexer in FIG. 8.

FIG. 9 is a block diagram showing the principal part of a communication apparatus 151 as an example of utilization of the SAN filter 51 (from another viewpoint, multiplexer 101). The communication apparatus 151 performs wireless communications utilizing radio waves and includes the multiplexer 101.

In the communication apparatus 151, a transmission information signal TIS including information to be transmitted is modulated and raised in frequency (converted to a high frequency signal having a carrier frequency) by an RF-IC (ratio frequency integrated circuit) 153 to become the transmission signal TS. The transmission signal TS is stripped of unwanted components other than the transmission-use passing band by a band pass filter 155, is amplified by an amplifier 157, and is input to the multiplexer 101 (transmission terminal 105). Further, the multiplexer 101 (transmission filter 109) strips the unwanted components other than the transmission-use passing band from the input transmission signal TS and outputs the transmission signal TS after stripping from the antenna terminal 103 to an antenna 159. The antenna 159 converts the input electrical signal (transmission signal TS) to a wireless signal (radio wave) and transmits the result.

Further, in the communication apparatus 151, the wireless signal (radio wave) received by the antenna 159 is converted to an electrical signal (reception signal RS) by the antenna 159 and is input to the multiplexer 101 (antenna terminal 103). The multiplexer 101 (receiving filter 111) strips unwanted components other than the reception-use passing band from the input reception signal RS and outputs the result from the reception terminal 107 to an amplifier 161. The output reception signal RS is amplified by the amplifier 161 and is stripped of unwanted components other than the reception-use passing band by a band pass filter 163. Further, the reception signal RS is boosted down in frequency and demodulated by the RF-IC 153 to become the reception information signal RIS.

Note that, the transmission information signal TIS and reception information signal RIS may be low frequency signals (baseband signals) containing suitable information. For example, they are analog audio signals or digital audio signals. The passing band of the wireless signal may be suitably set and may be based on various known standards. The modulation scheme may be any of phase modulation, amplitude modulation, frequency modulation, or a combination of any two or more among them. As the circuit system, a direct conversion system was illustrated. However, a suitable system other than that may be employed. For example, it may be a double superheterodyne system as well. Further, FIG. 9 is one schematically showing only the principal parts. A low pass filter or isolator etc. may be added to suitable positions. Further, the positions of the amplifier etc. may be changed as well.

Note that, in the above embodiment and modifications, each of the SAN filters 51 and 651 is one example of an acoustic wave filter. Each of the SAW resonators 201, 301, 401, and 501 according to the first to fourth modifications is one example of a first resonator. Each of the seventh parallel resonator 1P7 and the first parallel resonator 1P1 according to the fifth modification is one example of a parallel resonator in which an additional IDT electrode is assembled. The first GND terminal 3G1 is one example of a reference potential part.

The technique according to the present disclosure is not limited to the above embodiment and modifications and may be executed in various aspects.

For example, the resonator configuring the filter is not limited to one using an IDT electrode as an excitation electrode and may be a thin film bulk acoustic resonator as well. The acoustic wave is not limited to an SA. For example, it may be a bulk wave or an acoustic boundary wave (however, it may be one type of SAW) as well.

A configuration where the serial arm is folded back, as referred to also in the embodiment, can be realized by at least two serial resonators and one parallel resonator. Further, the serial arm may have two or more folded back portions as well. The shield conductor is not limited to the pattern on the piezoelectric substrate. For example, a cover covered on the piezoelectric substrate sometimes has a partition wall standing on the piezoelectric substrate between the first divided region 6A and the second divided region 6B. The shield conductor may be formed on this partition wall as well.

The capacitor element positioned between the serial arm and the shield conductor is not limited to one connected in parallel to the serial resonator. For example, the capacitor element may be one connected in parallel to the parallel resonator, may be one connected in series to the parallel resonator, or may be one for electromagnetic coupling of suitable portions in the filter body. Further, between the serial arm and the shield conductor, an element (for example inductor) other than the capacitor element may be arranged as well.

From the first to fourth modifications, the following concepts according to the acoustic wave element can be extracted.

(Concept 1)

An acoustic wave element including a piezoelectric substrate, an IDT electrode including a pair of comb-shaped electrodes on the piezoelectric substrate, and a reflector which is adjacent to the IDT electrode in a predetermined first direction on the piezoelectric substrate, wherein the pair of comb-shaped electrodes respectively include a bus bar and a plurality of electrode fingers which extend alongside each other from the bus bar to a second direction crossing the first direction, and are arranged in a state where they intermesh with each other, the tip ends of the electrode fingers in each comb-shaped electrode facing the other comb-shaped electrode across a gap in the second direction, the pluralities of electrode fingers, in the entireties of the pair of comb-shaped electrodes, include predetermined number of end part side electrode fingers counted from the end on the reflector side and a larger number of center side electrode fingers than the predetermined number, which are located at the center side in the IDT electrode relative to the predetermined number of end part side electrode fingers, and the gap of the end part side electrode fingers is larger than the gap of the center side electrode fingers in the second direction.

The acoustic wave element in Concept 1 described above is not limited to an acoustic wave resonator included in a ladder-type filter. For example, the mutually adjacent IDT electrode and reflector may be one of the pair of reflectors and an IDT electrode which is adjacent to that one reflector in a multiplex mode type filter. Further, in the acoustic wave element in Concept 1, in a case of an acoustic wave resonator included in a ladder-type filter, in the ladder-type filter, the serial arm need not be folded back and there may be only a single serial resonator.

Further, from the fifth modification, the following concepts according to the acoustic wave filter can be extracted.

(Concept 2)

An acoustic wave filter including
a piezoelectric substrate,
one or more serial resonators and one or more parallel resonators which are connected in a ladder shape on the piezoelectric substrate, and
an additional IDT electrode on the piezoelectric substrate connected in parallel to any one or more of the one or more serial resonators, wherein
  any of the one or more parallel resonators includes
    a parallel IDT electrode and
    a pair of parallel reflectors located on the two sides in a predetermined direction with respect to the parallel IDT electrode, and
the additional IDT electrode is adjacent to the parallel IDT electrode in the predetermined direction between the pair of parallel reflectors, the resonance frequency thereof being lower than the passing band realized by the one or more serial resonators and the one or more parallel resonators by a difference not less than the width of the passing band.

(Concept 3)

An acoustic wave filter including
a piezoelectric substrate,
one or more serial resonators and one or more parallel resonators which are connected in a ladder shape on the piezoelectric substrate, and
an additional IDT electrode on the piezoelectric substrate connected in parallel to a first serial resonator included in the one or more serial resonators, wherein
  the first serial resonator includes a first divided resonator and a second divided resonator which are connected in series to each other,
  a parallel resonator which is included in the one or more parallel resonators and is connected to the first divided resonator at the side opposite to the second divided resonator includes
    a parallel IDT electrode and
    a pair of parallel reflectors which are located on the two sides in a predetermined direction with respect to the parallel IDT electrode, and
the additional IDT electrode is connected in parallel to only the second divided resonator between the first divided resonator and the second divided resonator and is adjacent to the parallel IDT electrode between the pair of parallel reflectors in the predetermined direction.

In the acoustic wave filters in Concept 2 and Concept 3 described above, the serial arm need not be folded back and there may be only a single serial resonators.

REFERENCE SIGNS LIST

1S . . . serial resonator, 1P . . . parallel resonator, 5 . . . piezoelectric substrate, 51 . . . SAW filter (acoustic wave filter), 52 . . . filter body, 53 . . . serial arm, 63 . . . shield conductor, 59A . . . first divided arm, and 59B . . . second divided arm.

The invention claimed is:

1. An acoustic wave filter comprising:
a piezoelectric substrate,
a filter body on the piezoelectric substrate which comprises a serial arm including a plurality of serial resonators connected in series to each other and one or more parallel resonators in a state where they are connected in a ladder shape, and
a shield conductor connected to a reference potential part, wherein
a difference of resonance frequencies among the plurality of serial resonators is smaller than a half of a difference between the resonance frequency and an antiresonance frequency of each serial resonator,
the serial arm comprises
  a first divided arm which extends from one side toward the other side in a predetermined direction relative to the piezoelectric substrate and includes at least one of the serial resonators and
  a second divided arm which is folded back from a portion on the other side of the first divided arm and extends toward the one side and includes at least one of the serial resonators, and
the shield conductor comprises a portion which is located between at least one of the serial resonators included in the first divided arm and at least one of the serial resonators included in the second divided arm.

2. The acoustic wave filter according to claim 1, wherein the filter body further comprises a capacitor which is connected to the serial resonator or the parallel resonator and is located between the first divided arm and the shield conductor.

3. The acoustic wave filter according to claim 1, wherein the shield conductor is electrically separated from the filter body.

4. The acoustic wave filter according to claim 1, wherein
a first resonator included in the plurality of serial resonators and the one or more parallel resonators comprises
  an IDT electrode comprising a pair of comb-shaped electrodes on the piezoelectric substrate and
  a reflector adjacent in a predetermined first direction to the IDT electrode on the piezoelectric substrate,
the pair of comb-shaped electrodes
  respectively comprise
    a bus bar and
    a plurality of electrode fingers which extend from the bus bar alongside each other in a second direction crossing the first direction, and
  are arranged in a state where they intermesh with each other, the tip ends of the plurality of electrode fingers in each comb-shaped electrode facing the other comb-shaped electrode across a gap in the second direction, and
the pluralities of electrode fingers, in entireties of the pair of comb-shaped electrodes, include
  predetermined number of end part side electrode fingers counted from end on the reflector side and
  a larger number of center side electrode fingers than the predetermined number, which are located on the center side in the IDT electrode relative to the predetermined number of end part side electrode fingers, and
the gap of the end part side electrode fingers is larger in the second direction than the gap of the center side electrode fingers.

5. The acoustic wave filter according to claim 4, wherein the predetermined number is 1 to 4.

6. The acoustic wave filter according to claim 4, wherein:
each of the pair of comb-shaped electrodes comprises a plurality of dummy electrodes each projecting from a portion between two or more electrode fingers toward a direction of extension of the plurality of electrode fingers and which face the tip ends of the plurality of electrode fingers in the other comb-shaped electrode across the gap,
mutually facing edge parts of the pair of bus bars are parallel to each other,
the lengths of the end part side electrode fingers and the center side electrode fingers are equal, and
the dummy electrodes facing the tip ends of the end part side electrode fingers are shorter than the dummy electrodes facing the tip ends of the center side electrode fingers or are not provided.

7. The acoustic wave filter according to claim 4, wherein:
only one or more resonators in a portion among the plurality of serial resonators and the one or more parallel resonators is the first resonator, and
the one or more first resonators are larger in a ratio of a width of the electrode finger relative to a pitch of the mutually adjacent electrode fingers compared with the other resonators among the plurality of serial resonators and the one or more parallel resonators.

8. The acoustic wave filter according to claim 1, further comprising an additional IDT electrode on the piezoelectric substrate which is connected in parallel to any one or more of the plurality of serial resonators, wherein
any of the one or more parallel resonators comprises
a parallel IDT electrode and
a pair of parallel reflectors which are located on the two sides in a predetermined arrangement direction relative to the parallel IDT electrode, and
the additional IDT electrode is adjacent in the arrangement direction to the parallel IDT electrode between the pair of parallel reflectors and has a resonance frequency lower than a passing band realized by the plurality of serial resonators and the one or more parallel resonators by a difference not less than a width of the passing band.

9. The acoustic wave filter according to claim 1, further comprising an additional IDT electrode on the piezoelectric substrate connected in parallel to a first serial resonator included in the plurality of serial resonators, wherein
the first serial resonator comprises a first divided resonator and a second divided resonator which are connected in series to each other,
a parallel resonator which is included in the one or more parallel resonators and is connected to the first divided resonator at the side opposite to the second divided resonator comprises
a parallel IDT electrode and
a pair of parallel reflectors which are located on the two sides in a predetermined arrangement direction relative to the parallel IDT electrode, and
the additional IDT electrode is connected in parallel to only the second divided resonator between the first divided resonator and the second divided resonator, and is adjacent in the arrangement direction to the parallel IDT electrode between the pair of parallel reflectors.

10. A multiplexer comprising:
an antenna terminal,
a transmission filter connected to the antenna terminal, and
a receiving filter connected to the antenna terminal, wherein
at least one of the transmission filter and the receiving filter is configured by the acoustic wave filter according to claim 1.

11. The multiplexer according to claim 10, wherein:
a passing band of the transmission filter is higher than a passing band of the receiving filter,
the transmission filter is configured by the acoustic wave filter,
the acoustic wave filter of the transmission filter comprises an additional IDT electrode on the piezoelectric substrate which is connected in parallel to any one or more of the plurality of serial resonators,
any of the one or more parallel resonators comprises
a parallel IDT electrode and
a pair of parallel reflectors which are located on the two sides in a predetermined arrangement direction relative to the parallel IDT electrode, and
the additional IDT electrode is adjacent in the arrangement direction to the parallel IDT electrode between the pair of parallel reflectors and has a resonance frequency lower than a passing band realized by the plurality of serial resonators and the one or more parallel resonators by a difference not less than a width of the passing band
a resonance frequency of the additional IDT electrode is lower than the passing band of the receiving filter.

12. A communication apparatus comprising:
an acoustic wave filter according to claim 1,
an antenna connected to one end of the serial arm, and
an IC connected to the other end of the serial arm.

* * * * *